(12) United States Patent
Sakata et al.

(10) Patent No.: US 8,785,929 B2
(45) Date of Patent: Jul. 22, 2014

(54) SEMICONDUCTOR DEVICE AND METHOD FOR MANUFACTURING THE SAME

(71) Applicant: Semiconductor Energy Laboratory Co., Ltd., Atsugi (JP)

(72) Inventors: Junichiro Sakata, Atsugi (JP); Takashi Shimazu, Machida (JP); Hiroki Ohara, Sagamihara (JP); Toshinari Sasaki, Atsugi (JP); Shunpei Yamazaki, Setagaya (JP)

(73) Assignee: Semiconductor Energy Laboratory Co. Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 13/926,276

(22) Filed: Jun. 25, 2013

(65) Prior Publication Data

US 2013/0285052 A1  Oct. 31, 2013

(30) Foreign Application Priority Data

Jan. 23, 2009  (JP) .................................. 2009-013532

(51) Int. Cl.
*H01L 29/786* (2006.01)
(52) U.S. Cl.
USPC ........................................................... 257/43
(58) Field of Classification Search
CPC ........................... H01L 29/786; H01L 29/7869
USPC .............................................................. 257/43
See application file for complete search history.

(56) References Cited

U.S. PATENT DOCUMENTS

| | | |
|---|---|---|
| 3,767,434 A | 10/1973 | Thomas |
| 4,621,277 A | 11/1986 | Ito et al. |
| 5,731,856 A | 3/1998 | Kim et al. |
| 5,744,864 A | 4/1998 | Cillessen et al. |
| 5,847,410 A | 12/1998 | Nakajima |
| 6,294,274 B1 | 9/2001 | Kawazoe et al. |

(Continued)

FOREIGN PATENT DOCUMENTS

| | | |
|---|---|---|
| CN | 101335304 | 12/2008 |
| EP | 1 737 044 A | 12/2006 |

(Continued)

OTHER PUBLICATIONS

Minami et al., "Highly Conductive and Transparent Silicon Doped Zinc Oxide Thin Films Prepared by RF Magnetron Sputtering," Japanese Journal of Applied Physics, vol. 25, No. 9, pp. L776-L779, Sep. 1986.

(Continued)

*Primary Examiner* — Matthew W Such
*Assistant Examiner* — Monica D Harrison
(74) *Attorney, Agent, or Firm* — Eric J. Robinson; Robinson Intellectual Property Law Office, P.C.

(57) ABSTRACT

An object is to provide a semiconductor device including a thin film transistor which includes an oxide semiconductor layer and has high electric characteristics. An oxide semiconductor layer including $SiO_x$ is used in a channel formation region, and in order to reduce contact resistance with source and drain electrode layers formed using a metal material with low electric resistance, source and drain regions are provided between the source and drain electrode layers and the oxide semiconductor layer including $SiO_x$. The source and drain regions are formed using an oxide semiconductor layer which does not include $SiO_x$ or an oxynitiride film.

29 Claims, 29 Drawing Sheets

(56) References Cited

U.S. PATENT DOCUMENTS

| | | |
|---|---|---|
| 6,303,503 B1 | 10/2001 | Kamal et al. |
| 6,485,807 B1 | 11/2002 | Park |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,838,308 B2 | 1/2005 | Haga |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,291,967 B2 | 11/2007 | Sakata et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,385,265 B2 | 6/2008 | Manabe et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,648,861 B2 | 1/2010 | Yamazaki et al. |
| 7,674,650 B2 | 3/2010 | Akimoto et al. |
| 7,732,819 B2 | 6/2010 | Akimoto et al. |
| 7,868,326 B2 | 1/2011 | Sano et al. |
| 7,884,360 B2 | 2/2011 | Takechi et al. |
| 7,910,490 B2 | 3/2011 | Akimoto et al. |
| 7,932,521 B2 | 4/2011 | Akimoto et al. |
| 8,168,974 B2 | 5/2012 | Sano et al. |
| 8,178,926 B2 | 5/2012 | Nakayama |
| 8,258,023 B2 | 9/2012 | Lee |
| 8,274,077 B2 | 9/2012 | Akimoto et al. |
| 8,338,827 B2 | 12/2012 | Yamazaki et al. |
| 8,420,442 B2 | 4/2013 | Takechi et al. |
| 8,492,756 B2 * | 7/2013 | Sakata et al. .......... 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0039670 A1 | 2/2005 | Hosono et al. |
| 2005/0062134 A1 | 3/2005 | Ho et al. |
| 2005/0127380 A1 | 6/2005 | Kawasaki et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152214 A1 | 7/2007 | Hoffman et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0259466 A1 | 11/2007 | Sakata et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0309096 A1 | 12/2009 | Iwasaki |
| 2010/0025678 A1 | 2/2010 | Yamazaki et al. |
| 2010/0065844 A1 | 3/2010 | Tokunaga |
| 2010/0090215 A1 | 4/2010 | Lee |
| 2010/0092800 A1 | 4/2010 | Itagaki et al. |
| 2010/0109002 A1 | 5/2010 | Itagaki et al. |
| 2010/0117073 A1 | 5/2010 | Yamazaki et al. |
| 2010/0136743 A1 | 6/2010 | Akimoto et al. |
| 2010/0181565 A1 | 7/2010 | Sakata et al. |
| 2010/0200851 A1 | 8/2010 | Oikawa et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2012/0214276 A1 | 8/2012 | Oikawa et al. |
| 2012/0319103 A1 | 12/2012 | Lee |
| 2013/0130438 A1 | 5/2013 | Yamazaki et al. |
| 2013/0237012 A1 | 9/2013 | Takechi et al. |

FOREIGN PATENT DOCUMENTS

| | | |
|---|---|---|
| EP | 1 770 788 A | 4/2007 |
| EP | 1 995 787 A | 11/2008 |
| EP | 1 998 373 A | 12/2008 |
| EP | 1 998 374 A | 12/2008 |
| EP | 1 998 375 A | 12/2008 |

(56) References Cited

FOREIGN PATENT DOCUMENTS

| | | |
|---|---|---|
| EP | 2 226 847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 | 10/1991 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086010 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2005-093974 | 4/2005 |
| JP | 2006-165529 | 6/2006 |
| JP | 2006-173580 A | 6/2006 |
| JP | 2007-073703 | 3/2007 |
| JP | 2007-096055 | 4/2007 |
| JP | 2007-123861 | 5/2007 |
| JP | 2007-250983 | 9/2007 |
| JP | 2008-042088 A | 2/2008 |
| JP | 2008-235871 | 10/2008 |
| JP | 2010-135774 | 6/2010 |
| WO | WO 2004/114391 | 12/2004 |
| WO | WO-2006/051995 | 5/2006 |
| WO | WO 2007/119386 | 10/2007 |
| WO | WO 2008/105347 | 9/2008 |
| WO | WO 2008/133456 | 11/2008 |

OTHER PUBLICATIONS

Prins et al., "A Ferroelectric Transparent Thin-Film Transistor," Appl. Phys. Lett. (Applied Physics Letters), vol. 68, No. 25, pp. 3650-3652, Jun. 17, 1996.

Nakamura et al., "The Phase Relations in the $In_2O_3$-$Ga_2ZnO_4$-ZnO System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nakamura, et al., Syntheses and Crystal Structures of New Homologous Compounds, Indium Iron Zinc Oxides $(InFeO_3(ZnO)_m$ (m: natural number) and Related Compounds, Kotai Butsuri (Solid State Physics), vol. 28, No. 5, pp. 317-327, 1993.

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.

Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO $(Ga_2O_3$-$In_2O_3$-ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

(56) References Cited

OTHER PUBLICATIONS

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In-Ga-Zn-Oxide TFTs," IDW '09: Proceedings of the 16$^{th}$ International Display Workshops, 2009, pp. 689-692.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel using Amorphous In-Ga-Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 In. QVGA AMOLED Display Using In-Ga-Zn-Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," Nirim Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000° C," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent InGaZnO4," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317, ECS.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO3$ with Sputtered $Al2O3$ Gate Insulator," Appl. Phys. Lett. (Applied Physics Letters), Sep. 1, 2003, vol. 83, No. 9, pp. 1755-1757.

Chiang et al., "High Mobility Transparent Thin-Film Transistors With Amorphous Zinc Tin Oxide Channel Layer," Appl. Phys. Lett. (Applied Physics Letters), 2005, vol. 86, No. 1, pp. 013503-1-013503-3.

Miyasako et al., "Ferroelectric-Gate Thin-Film Transistors Using Indium-Tin-Oxide Channel With Large Charge Controllability," Appl. Phys. Lett. (Applied Physics Letters), 2005, vol. 86, No. 16, pp. 162902-1-162902-3.

(56) References Cited

OTHER PUBLICATIONS

Nishii et al., "High-Mobility Field-Effect Transistors Based on Single-Crystalline ZnO Channels," Jpn. J. Appl. Phys. (Japanese Journal of Applied Physics), Sep. 9, 2005, vol. 44, No. 38, pp. L1193-L1195.

Minami et al., "Highly Transparent and Conductive Zinc-Stannate Thin Films Prepared by RF Magnetron Sputtering," Jpn. J. Appl. Phys. (Japanese Journal of Applied Physics), Dec. 1, 1994, vol. 33, No. 12A, pp. L1693-L1696.

Chinese Office Action (Application No. 201010110174.5) dated May 29, 2013.

* cited by examiner

FIG. 5A
(A1)
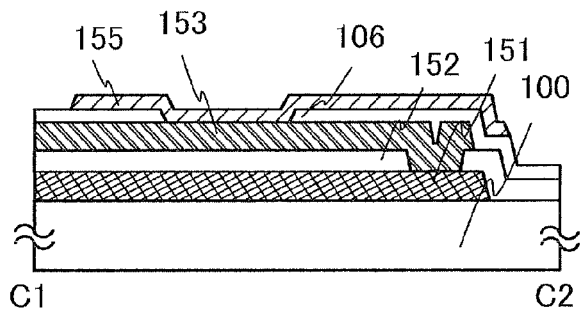
(A2)
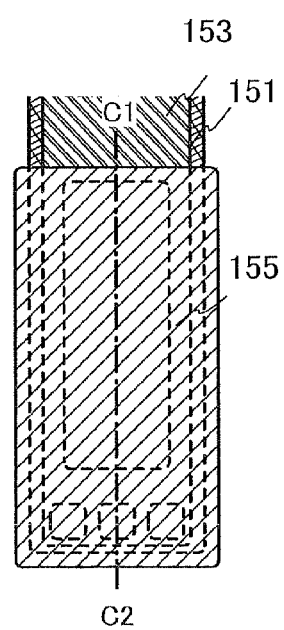
FIG. 5B
(B1)
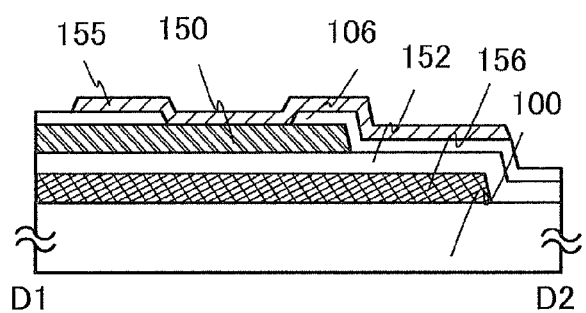
(B2)
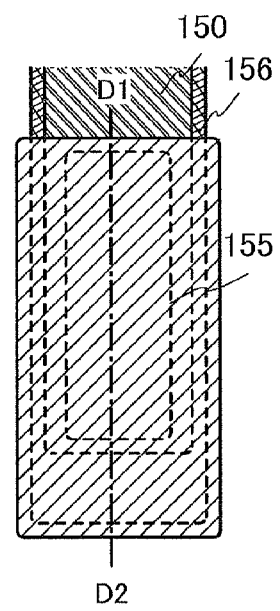

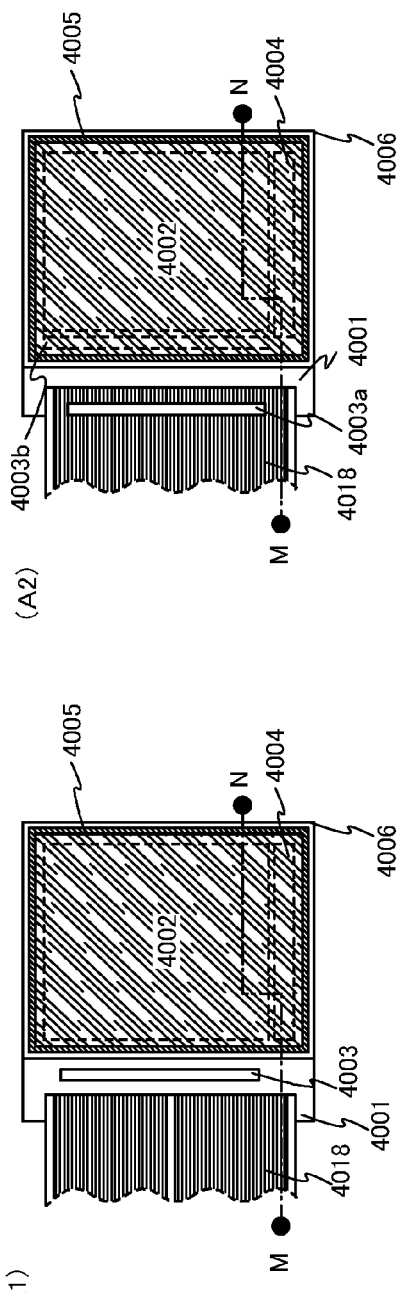
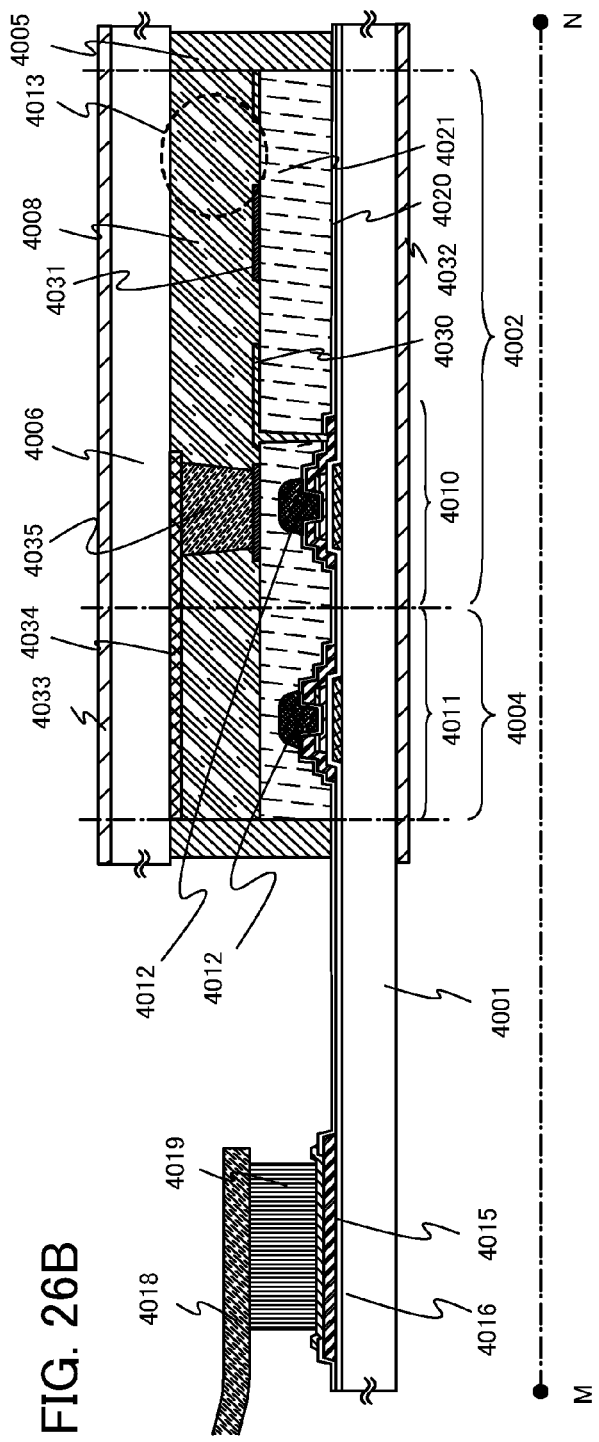
FIG. 26A
FIG. 26B

FIG. 29A
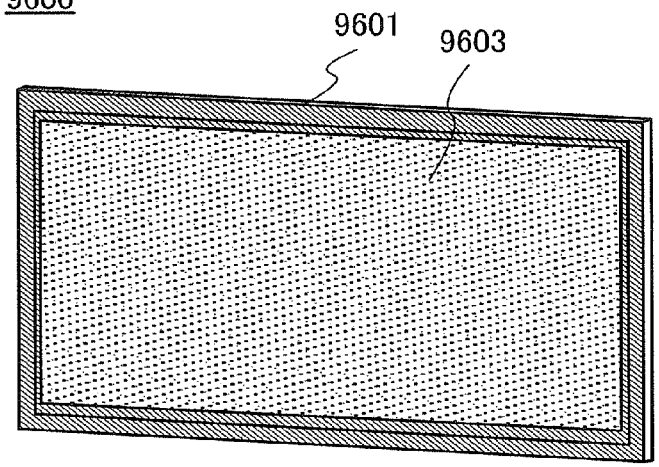
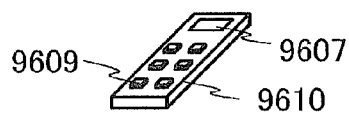
FIG. 29B
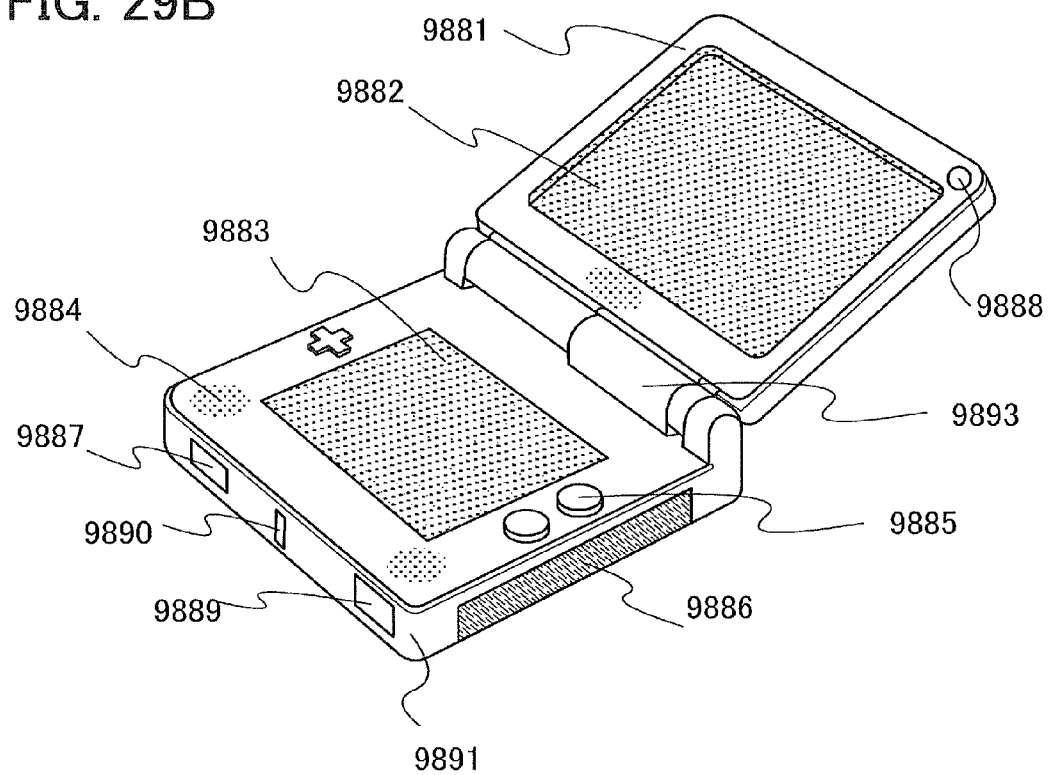

SEMICONDUCTOR DEVICE AND METHOD FOR MANUFACTURING THE SAME

BACKGROUND OF THE INVENTION

1. Field of the Invention

The present invention relates to a semiconductor device including a circuit which includes a thin film transistor (hereinafter, referred to as TFT) and a manufacturing method thereof. For example, the present invention relates to an electronic appliance mounted with an electro-optic device typified by a liquid crystal display panel or a light-emitting display device including an organic light-emitting element as a component.

In this specification, a semiconductor device refers to all types of devices which can function by using semiconductor characteristics. An electro-optical device, a semiconductor circuit, and an electronic device are included in the category of all semiconductor devices.

2. Description of the Related Art

There are a variety of kinds of metal oxides intended for many uses. Indium oxide is a well-known material and is used for a transparent electrode material necessary for a liquid crystal display or the like.

Further, some metal oxides have semiconductor characteristics. The metal oxides having semiconductor characteristics are one kind of a compound semiconductor. The compound semiconductor is a semiconductor formed by two or more kinds of atoms bonded together. In general, metal oxides are insulators; however, it is known that metal oxides are semiconductors depending on the combination of elements included in the metal oxides.

For example, among metal oxides, tungsten oxide, tin oxide, indium oxide, zinc oxide, and the like are known as the metal oxides having semiconductor characteristics. The metal oxide as above is used for a transparent semiconductor layer serving as a channel formation region in a thin film transistor (as disclosed in Patent Documents 1 to 4 and Non-patent Document 1).

Examples of metal oxides include not only an oxide of a single metal element but also an oxide of a plurality of metal elements. For example, $InGaO_3(ZnO)_m$ (m is a natural number) which is a homologous compound is a known material (Non-patent Documents 2 to 4).

Then, it has been confirmed that such an In—Ga—Zn-based oxide as above is applicable to a channel layer of a thin film transistor (Patent Document 5 and Non-patent Documents 5 and 6).

Further, attention has been drawn to a technique for manufacturing a thin film transistor using an oxide semiconductor and applying the thin film transistor to an electronic device or an optical device. For example, Patent Document 6 and Patent Document 7 disclose a technique by which a thin film transistor is manufactured using zinc oxide or an In—Ga—Zn—O-based oxide semiconductor as an oxide semiconductor film and such a transistor is used as a switching element or the like of an image display device.

REFERENCE

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Patent Document 6] Japanese Published Patent Application No. 2007-123861
[Patent Document 7] Japanese Published Patent Application No. 2007-096055

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68 p. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, p. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, p. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", *KOTAI BUTSURI (SOLID STATE PHYSICS)*, 1993, Vol. 28, No. 5, p. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, p. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 p. 488-492

An object of an embodiment of the present invention is to provide a semiconductor device including a thin film transistor which includes an oxide semiconductor layer and has high electric characteristics.

SUMMARY OF THE INVENTION

In order to realize an amorphous oxide semiconductor layer, a thin film transistor which includes an oxide semiconductor layer including silicon oxide or silicon oxynitride is provided. Typically, an oxide semiconductor layer is formed with use of an oxide semiconductor target containing $SiO_2$ at from 0.1 wt % to 20 wt % inclusive, preferably, at from 1 wt % to 6 wt % inclusive, and $SiO_x$ (x>0) which hinders crystallization is added to the oxide semiconductor layer, whereby a thin film transistor whose channel is formed at a gate threshold voltage which is a positive value and as close to 0 V as possible is realized.

The oxide semiconductor layer including $SiO_x$ includes an In—Ga—Zn—O-based oxide semiconductor, an In—Zn—O-based oxide semiconductor, a Sn—Zn—O-based oxide semiconductor, an In—Sn—O-based oxide semiconductor, a Ga—Zn—O-based oxide semiconductor, or a Zn—O-based oxide semiconductor.

In order to reduce contact resistance with source and drain electrode layers which are formed using a metal material with low electric resistance, source and drain regions are formed between the source and drain electrode layers and the oxide semiconductor layer including $SiO_x$.

The source and drain regions include an oxide semiconductor layer which does not include $SiO_x$, e.g, an In—Ga—Zn—O-based oxide semiconductor which does not include $SiO_x$, an In—Zn—O-based oxide semiconductor which does not include $SiO_x$, a Sn—Zn—O-based oxide semiconductor which does not include $SiO_x$, an In—Sn—O-based oxide semiconductor which does not include $SiO_x$, a Ga—Zn—O-based oxide semiconductor which does not include $SiO_x$, or a Zn—O-based oxide semiconductor which does not include $SiO_x$. Alternatively, the source and drain regions may include an In—Ga—Zn—O-based non-single-crystal film including nitrogen, that is, an In—Ga—Zn—O—N-based non-single-crystal film (also referred to as an IGZON film). This In—Ga—Zn—O—N-based non-single-crystal film is formed as follows: an oxynitride film containing indium, gallium, and zinc is formed in an atmosphere containing a nitrogen gas with use of a target containing an oxide which contains indium, gallium, and zinc; and the oxynitride film is subjected to heat treatment. Further alternatively, the source and drain regions may include a Ga—Zn—O-based non-single-crystal film including nitrogen, that is, a Ga—Zn—O—N-based non-single-crystal film (also referred to as a GZON film); a Zn—O-based non-single-crystal film including nitrogen, that is, a Zn—O—N-based non-single-crystal film; or a Sn—Zn—O-based non-single-crystal film including nitrogen, that is, a Sn—Zn—O—N-based non-single-crystal film.

As a material of the source and drain electrode layers, there are an element selected from Al, Cr, Ta, Ti, Mo, and W, an alloy containing any of these elements, an alloy film containing a combination of any of these elements, and the like.

An embodiment of the present invention disclosed in this specification is a semiconductor device including a gate electrode over an insulating surface, an oxide semiconductor layer including $SiO_x$, an insulating layer between the gate electrode and the oxide semiconductor layer, and source and drain regions between the oxide semiconductor layer including $SiO_x$ and source and drain electrode layers. The source and drain regions are formed using an oxide semiconductor material or an oxynitride material.

Note that the oxide semiconductor layer including $SiO_x$ is formed by a sputtering method with use of an oxide semiconductor target containing $SiO_2$ at from 0.1 wt % to 20 wt % inclusive.

Another embodiment of the present invention for the purpose of realizing the above structure is a method for manufacturing a semiconductor device including the steps of forming a gate electrode over an insulating surface, forming an insulating layer over the gate electrode, forming an oxide semiconductor layer including $SiO_x$, over the insulating layer by a sputtering method with use of a first oxide semiconductor target containing $SiO_2$ at from 0.1 wt % to 20 wt % inclusive, and forming an oxynitirde layer over the oxide semiconductor layer including $SiO_x$ by a sputtering method with use of a second oxide semiconductor target in an atmosphere containing nitrogen.

In the above manufacturing method, after the oxynitride layer is formed, a part of the oxynitride layer which overlaps with the gate electrode is removed, whereby the oxide semiconductor layer including $SiO_x$ is partly exposed. Thus, a channel-etch type thin film transistor is formed.

The thin film transistor of the present invention is not limited to the channel-etch type thin film transistor, but a bottom-gate type thin film transistor, a bottom-contact type thin film transistor, or a top-gate type thin film transistor can be formed.

Another embodiment of the present invention is a method for manufacturing a semiconductor device including the steps of forming an oxide semiconductor layer including $SiO_x$ over an insulating surface by a sputtering method with use of a first oxide semiconductor target containing $SiO_2$ at from 0.1 wt % to 20 wt % inclusive, forming an oxynitride layer over the oxide semiconductor layer including $SiO_x$ by a sputtering method with use of a second oxide semiconductor target in an atmosphere containing nitrogen, forming an insulating layer covering the oxynitride layer, and forming a gate electrode over the insulating layer.

In each of the above manufacturing methods, the oxynitride layer is used as source and drain regions which are provided between source and drain electrode layers and the oxide semiconductor layer including $SiO_x$, in order to reduce contact resistance with the source and drain electrode layers formed using a metal material with low electric resistance value.

An object of the present invention is to realize a semiconductor device including a thin film transistor which includes an oxide semiconductor layer including $SiO_x$, and has high electric characteristics.

BRIEF DESCRIPTION OF THE DRAWINGS

FIGS. 5A and 5B are a cross-sectional view and a top view, respectively, illustrating an embodiment of the present invention.

FIGS. 26A1 and A2 are top views and FIG. 26B is a cross-sectional view, of a semiconductor device illustrating an embodiment of the present invention.

FIGS. 29A and 29B each illustrate an electronic appliance of an embodiment of the present invention.

DETAILED DESCRIPTION OF THE INVENTION

Embodiments of the present invention are hereinafter described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, an example of a thin film transistor including an oxide semiconductor layer including $SiO_x$ is described with reference to FIGS. 1A and 1B.

Figure 1A:
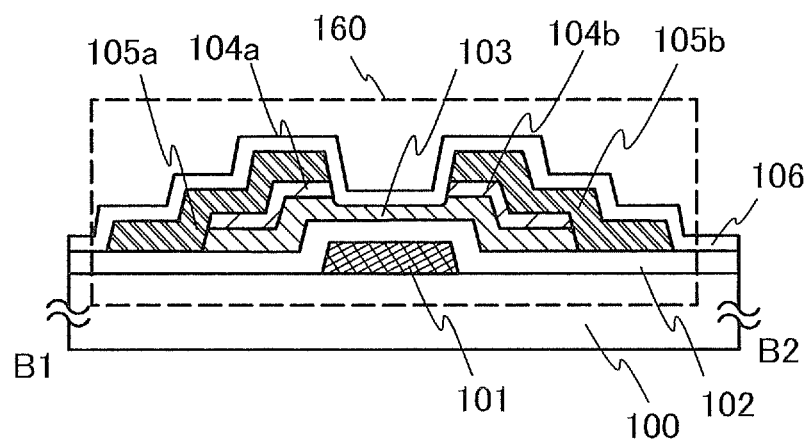
FIGS. 1A and 1B are a cross-sectional view and a top view, respectively, illustrating an embodiment of the present invention.
Figure 1B:
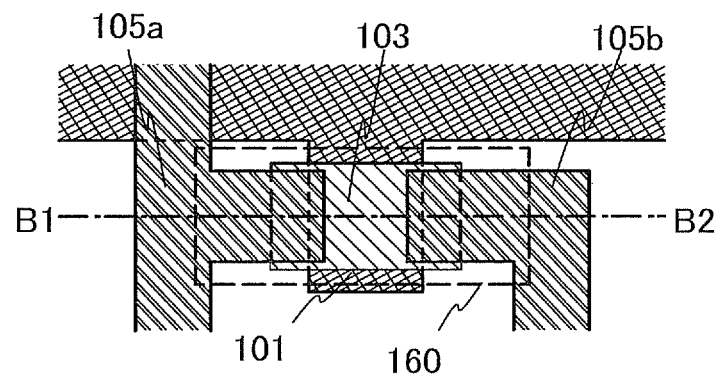

FIG. 1A illustrates a thin film transistor 160 which is one type of bottom-gate structure, and is a cross-sectional view of a structure called a channel-etch type. FIG. 1B illustrates an example of a top view of the thin film transistor whose cross section taken along line B1-B2 corresponds to FIG. 1A.

The thin film transistor 160 illustrated in FIG. 1A includes a gate electrode layer 101 over a substrate 100, a gate insulating layer 102 over the gate electrode layer 101, an oxide semiconductor layer 103 including $SiO_x$ which is over the gate insulating layer 102 and overlaps with the gate electrode layer 101, and source and drain electrode layers 105a and 105b which partly overlap with the oxide semiconductor layer 103 including $SiO_x$. In addition, source and drain regions 104a and 104b are provided between parts of the oxide semiconductor layer 103 including $SiO_x$ and the source and drain electrode layers 105a and 105b. Moreover, a protective insulating layer 106 is provided, which is in contact with and covers the oxide semiconductor layer 103 including $SiO_x$ and the source and drain electrode layers 105a and 105b.

The gate electrode layer 101 can be formed with a single layer or a stacked layer using a metal material such as aluminum, copper, molybdenum, titanium, chromium, tantalum, tungsten, neodymium, or scandium; an alloy material which contains any of these materials as a main component; or a nitride containing any of these materials. It is preferable to use a low-resistance conductive material such as aluminum or copper. However, such a low-resistance conductive material has the disadvantages of low heat resistance, being easily corroded, and the like; thus, it is used in combination with a conductive material having heat resistance. As the conductive material having heat resistance, molybdenum, titanium, chromium, tantalum, tungsten, neodymium, scandium, or the like is used.

For example, a stacked structure of the gate electrode layer 101 is preferably a two-layer structure where a molybdenum layer is stacked over an aluminum layer, a two-layer structure where a molybdenum layer is stacked over a copper layer, a two-layer structure where a titanium nitride layer or a tantalum nitride layer is stacked over a copper layer, or a two-layer structure where a titanium nitride layer and a molybdenum layer are stacked. Alternatively, a three-layer structure where a tungsten layer or a tungsten nitride layer, an aluminum-silicon alloy layer or an aluminum-titanium alloy layer, and a titanium nitride layer or a titanium layer are stacked is preferable.

The gate insulating layer 102 is formed by a plasma CVD method or a sputtering method. The gate insulating layer 102 can be formed with a single layer or a stacked layer using any of a silicon oxide layer, a silicon nitride layer, a silicon oxynitride layer, and a silicon nitride oxide layer by a CVD method, a sputtering method, or the like. Alternatively, the gate insulating layer 102 can be formed of a silicon oxide layer by a CVD method using an organosilane gas.

The oxide semiconductor layer 103 including $SiO_x$ is formed from an In—Ga—Zn—O-based non-single-crystal film, or includes an In—Sn—Zn—O-based oxide semiconductor, a Ga—Sn—Zn—O-based oxide semiconductor, an In—Zn—O-based oxide semiconductor, a Sn—Zn—O-based oxide semiconductor, an In—Sn—O-based oxide semiconductor, a Ga—Zn—O-based oxide semiconductor, or a Zn—O-based oxide semiconductor.

In this embodiment, the oxide semiconductor layer 103 including $SiO_x$ is formed by a sputtering method with use of an oxide semiconductor target containing $SiO_2$ at 5 wt % ($SnO_2:ZnO=1:1$). In this case, the oxide semiconductor layer 103 including $SiO_x$ is formed to be a film including Sn at from 0.01 wt % to 60 wt % inclusive, preferably at from 3 wt % to 50 wt % inclusive.

The source and drain regions 104a and 104b include an oxide semiconductor layer which does not include $SiO_x$, e.g., an In—Ga—Zn—O-based oxide semiconductor which does not include $SiO_x$, an In—Zn—O-based oxide semiconductor which does not include $SiO_x$, a Sn—Zn—O-based oxide semiconductor which does not include $SiO_x$, an In—Sn—O-based oxide semiconductor which does not include $SiO_x$, a Ga—Zn—O-based oxide semiconductor which does not include SiO$_x$, or a Zn—O-based oxide semiconductor which does not include SiO$_x$. Alternatively, the source and drain regions 104a and 104b may be formed from an In—Ga—Zn—O-based non-single-crystal film including nitrogen, that is, an In—Ga—Zn—O—N-based non-single-crystal film (also referred to as an IGZON film). Further alternatively, the source and drain regions 104a and 104b may be formed from a Ga—Zn—O-based non-single-crystal film including nitrogen, that is, a Ga—Zn—O—N-based non-single-crystal film (also referred to as a GZON film), a Zn—O—N-based non-single-crystal film including nitrogen, or a Sn—Zn—O—N-based non-single-crystal film including nitrogen may be used.

In this embodiment, the source and drain regions 104a and 104b are formed using an oxynitride material. The oxynitride material is obtained as follows: sputtering is performed in an atmosphere containing a nitrogen gas, with use of an oxide semiconductor target containing In (indium), Ga (gallium), and Zn (zinc) (In$_2$O$_3$:Ga$_2$O$_3$:ZnO=1:1:1), so that an oxynitiride film containing indium, gallium, and zinc is formed; and the oxynitride film is subjected to heat treatment.

The source and drain regions 104a and 104b do not include Si, which is a major different point from the oxide semiconductor layer 103 including SiO$_x$. In the source and drain regions 104a and 104b, in some cases, crystal grains are generated immediately after the film formation or crystal grains are generated in the case where heat treatment is performed after film formation. On the other hand, in the oxide semiconductor layer 103 including SiO$_x$, the crystallization temperature of the film is high, which is caused by inclusion of SiO$_x$. Thus, for example, even if heat treatment is performed at a temperature at which the source and drain regions 104a and 104b are partly crystallized, the oxide semiconductor layer 103 including SiO$_x$ can keep an amorphous state.

The source and drain electrode layers 105a and 105b are formed using an element selected from Al, Cr, Ta, Ti, Mo, and W, an alloy containing any of these elements, an alloy film containing a combination of any of these elements, or the like.

The source and drain regions 104a and 104b enable contact resistance with the source and drain electrode layers 105a and 105b formed using a metal material with low electric resistance to be reduced. Accordingly, by providing the source and drain regions 104a and 104b, the thin film transistor 160 with higher electric characteristics is realized.

Further, the protective insulating layer 106 can have a single layer structure or a stacked-layer structure using any of a silicon nitride film, a silicon oxide film, a silicon oxynitride film, and the like, which is formed by a sputtering method or the like.

Embodiment 2

In this embodiment, an example of a thin film transistor which is different in the width of a gate electrode from that of Embodiment 1 is described with reference to FIGS. 2A and 2B.

Figure 2A:
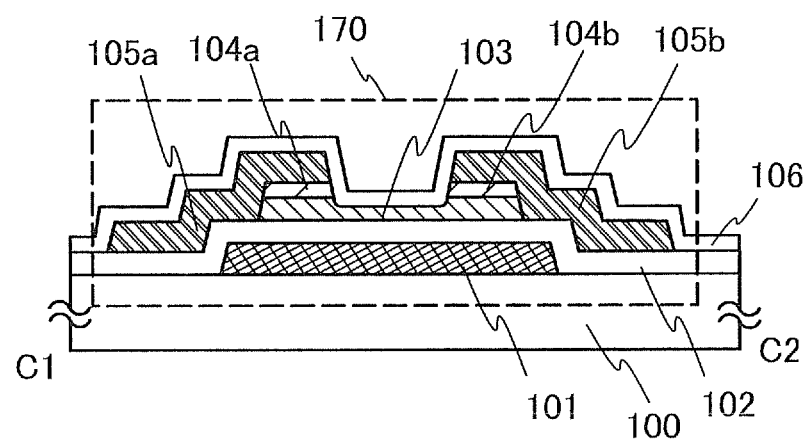
FIGS. 2A and 2B are a cross-sectional view and a top view, respectively, illustrating an embodiment of the present invention.
Figure 2B:
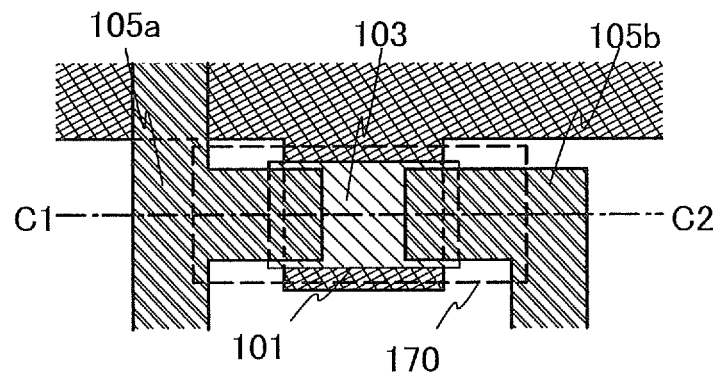

FIG. 2A illustrates a thin film transistor 170 which is one type of bottom-gate structure, and is an example of a cross-sectional view of a structure called a channel-etch type. FIG. 2B is an example of a top view of the thin film transistor whose cross section taken along dotted line C1-C2 corresponds to FIG. 2A The thin film transistor 170 illustrated in FIG. 2A includes a gate electrode layer 101 over a substrate 100, a gate insulating layer 102 over the gate electrode layer 101, oxide semiconductor layers over the gate insulating layer 102, a source and drain electrode layers 105a and 105b over the oxide semiconductor layers, and a protective insulating layer 106 covering the stacked oxide semiconductor layers and the source and drain electrode layers 105a and 105b.

In this embodiment, over the gate insulating layer 102, an oxide semiconductor layer 103 including SiO$_x$ (also referred to as a first oxide semiconductor layer) and a second oxide semiconductor layer (or an oxynitride layer) are stacked. However, the second oxide semiconductor layer is not formed over a region which functions as a channel in the oxide semiconductor layer 103 including SiO$_x$ because the second oxide semiconductor layer over the region is removed by etching. Note that the second oxide semiconductor layer (or the oxynitride layer) serves as a buffer layer, an n$^+$ layer, and source and drain regions. In FIG. 2A, the second oxide semiconductor layer is illustrated as the source and drain regions 104a and 104b.

In this embodiment, the oxide semiconductor layer 103 including SiO$_x$ is formed with use of an oxide semiconductor target containing In (indium), Ga (gallium), and Zn (zinc), in which SiO$_2$ is included at from 0.1 wt % to 20 wt % inclusive, preferably, at from 1 wt % to 6 wt % inclusive. Inclusion of SiO$_x$ in an oxide semiconductor makes an oxide semiconductor film to be formed easy to be amorphous. In addition, in the case where the oxide semiconductor film is subjected to heat treatment, crystallization of the oxide semiconductor film can be suppressed.

Change in a structure of an oxide semiconductor containing In (indium), Ga (gallium), and Zn (zinc) which is so-called IGZO, by including SiO$_2$ therein, was calculated by the classical molecular dynamics simulation. In the classical molecular dynamics simulation, empirical potential characterizing interaction between atoms is defined, whereby force acting on each atom is evaluated, and Newton's equation of motion is numerically solved, whereby motion (time-dependent change) of each atom can be deterministically tracked.

Hereinafter, calculation models and calculation conditions are described. Note that in this calculation, the Born-Mayer-Huggins potential was used.

A single crystal structure of InGaZnO$_4$ including 1680 atoms (see FIG. 7) and a structure of InGaZnO$_4$ including 1680 atoms in which 20 atoms of each of In, Ga, and Zn were substituted by Si atoms (see FIG. 8) were formed. In the model of Si substitution, Si atoms were included at 3.57 atoms % (2.34 wt %). The density of the model of the single crystal was 6.36 g/cm$^3$, and the density of the model of Si substitution was 6.08 g/cm$^3$.

At 1727° C. which is equal to or lower than the melting point of the InGaZnO$_4$ single crystal (about 2000° C. according to estimation by the classical molecular dynamics simulation), structure relaxation was performed by the classical molecular dynamics simulation at a fixed pressure (1 atm) for 150 psec (time step width 0.2 fsec×750000 steps). The radial distribution functions g (r) of the two structures were calculated. Note that the radial distribution function g (r) is a function representing the probability density of atoms existing at a distance of r from one atom. As the correlation between atoms disappears, g (r) is close to 1.

Figure 7:
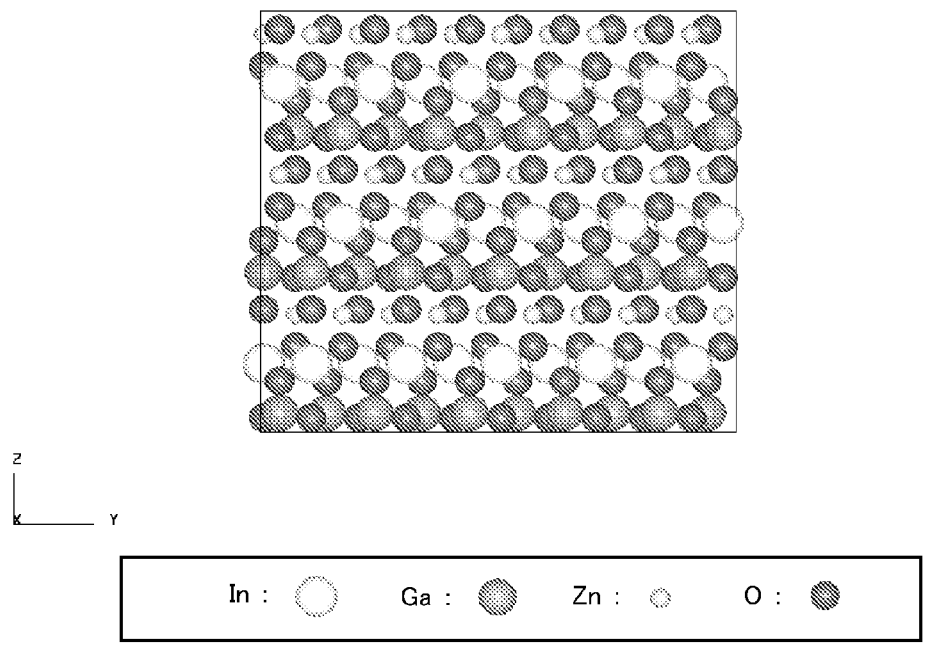
FIG. 7 is a model diagram showing a single crystal structure of $InGaZnO_4$.
Figure 8:
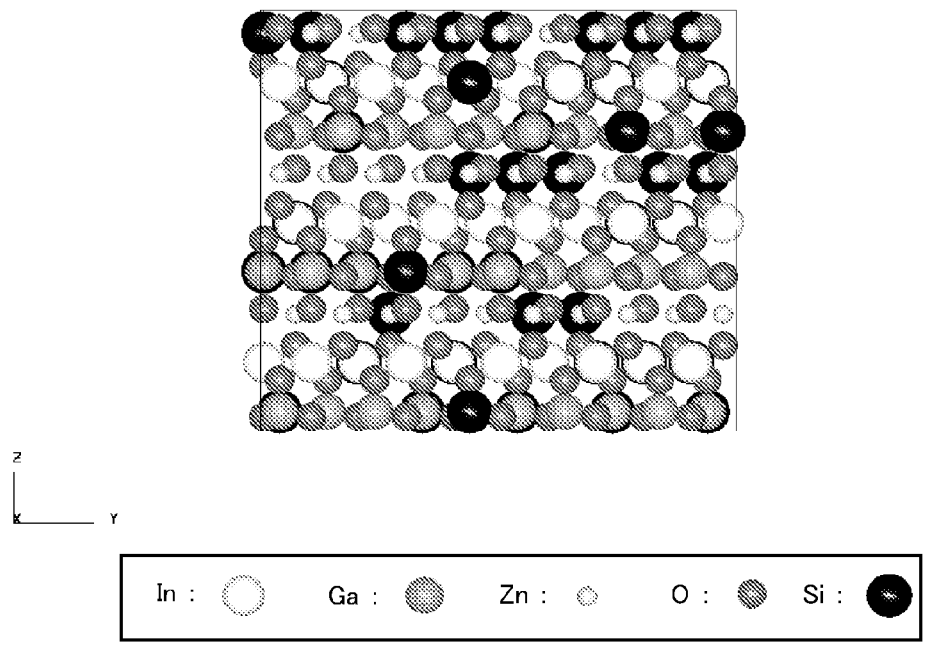
FIG. 8 is a diagram showing a Si substitution model.
Figure 9:
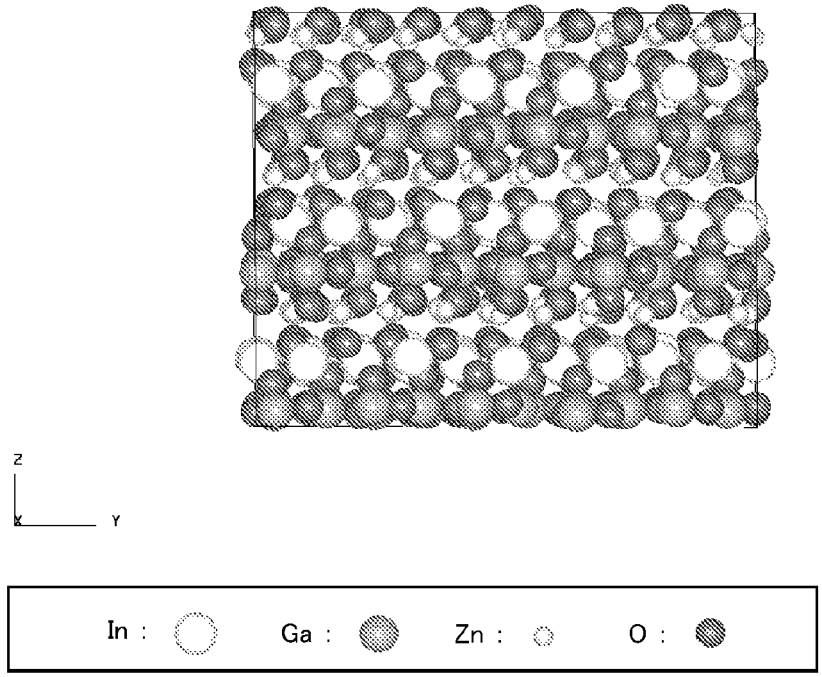
FIG. 9 is a diagram showing a final structure of the single crystal model.
Figure 10:
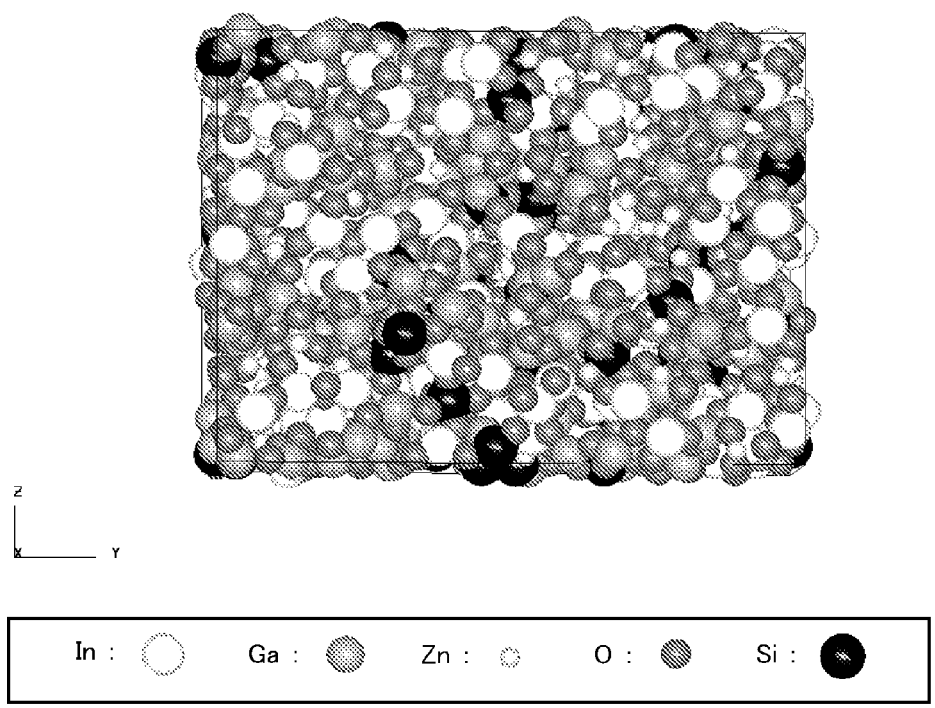
FIG. 10 is a diagram showing a final structure of the Si substitution model.
Figure 11:
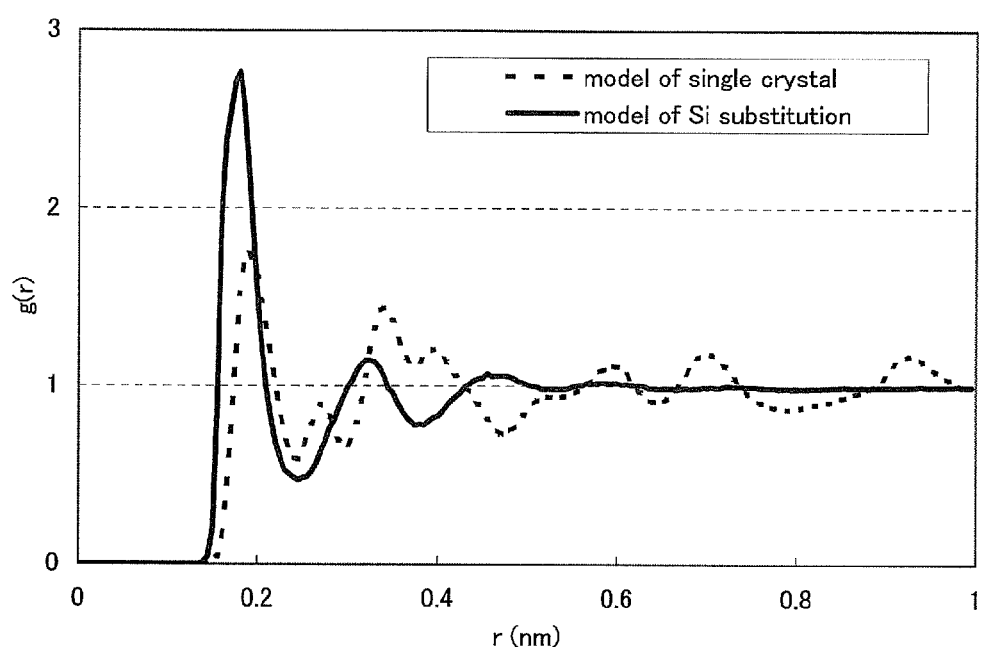
FIG. 11 is a graph showing a radical distribution function g (r) of each model.

FIG. 9 and FIG. 10 show final structures obtained by performing the classical molecular dynamics simulation for 150 psec on the above two calculation models of FIG. 7 and FIG. 8. In addition, FIG. 11 shows the radial distribution function g (r) in each structure.

The model of single crystal shown in FIG. 9 is stable and keeps the crystal structure even in the final structure, whereas the model of Si substitution shown in FIG. 10 is unstable, and it can be observed that the crystal structure is distorted with time and changes into an amorphous structure. As seen in FIG. 11, by comparing the radial distribution functions g (r) of the structural models with each other, it is found that the model of single crystal has peaks even at a long distance and the long-range order. On the other hand, it is found that in the model of Si substitution, the peak disappears at a distance about 0.6 nm, and the model of Si substitution does not have the long-range order.

These calculation results indicate that in the case of including $SiO_2$, the IGZO thin film with the amorphous structure is more stable than that with a crystalline structure, and IGZO is easily to be amorphous by including $SiO_2$ in the IGZO thin film. The IGZO thin film including $SiO_2$ immediately after deposition, which is practically obtained by a sputtering method, is an amorphous semiconductor film. Thus, according to these calculation results, the IGZO thin film including $SiO_2$ can hinder crystallization even if heat treatment is performed at high temperature, and can keep the amorphous structure.

Instead of an In—Ga—Zn—O-based non-single-crystal film, the oxide semiconductor layer 103 including $SiO_x$ can be formed using an In—Sn—Zn—O-based, Ga—Sn—Zn—O-based, In—Zn—O-based, Sn—Zn—O-based, In—Sn—O-based, Ga—Zn—O-based, or Zn—O-based oxide semiconductor.

The source and drain regions 104a and 104b include an oxide semiconductor layer which does not include $SiO_x$, e.g., an In—Ga—Zn—O-based oxide semiconductor which does not include $SiO_x$, an In—Zn—O-based oxide semiconductor which does not include $SiO_x$, a Sn—Zn—O-based oxide semiconductor which does not include $SiO_x$, an In—Sn—O-based oxide semiconductor which does not include $SiO_x$, a Ga—Zn—O-based oxide semiconductor which does not include $SiO_x$, or a Zn—O-based oxide semiconductor which does not include $SiO_x$. Alternatively, the source and drain regions 104a and 104b may be formed from an In—Ga—Zn—O—N-based non-single-crystal film, a Ga—Zn—O—N-based non-single-crystal film, a Zn—O—N-based non-single-crystal film, or a Sn—Zn—O—N-based non-single-crystal film.

In this embodiment, the source and drain regions 104a and 104b are formed using an oxynitride material. The oxynitride material is obtained as follows: sputtering is performed in an atmosphere containing a nitrogen gas, with use of an oxide semiconductor target containing Sn (tin) and Zn (zinc) ($SnO_2$:ZnO=1:1), so that a Sn—Zn—O—N-based non-single-crystal film is formed; and the Sn—Zn—O—N-based non-single-crystal film is subjected to heat treatment.

Hereinafter, an example of manufacturing a display device using the above thin film transistor 170 as a switching element of a pixel portion is described.

First, the gate electrode layer 101 is provided over the substrate 100 having an insulating surface. A glass substrate is used as the substrate 100 having an insulating surface. The gate electrode layer 101 can be formed with a single layer or a stacked layer using a metal material such as molybdenum, titanium, chromium, tantalum, tungsten, aluminum, copper, neodymium, or scandium, or an alloy material which contains any of these materials as a main component. Note that when the gate electrode layer 101 is formed, a capacitor wiring 108 of the pixel portion and a first terminal 121 of a terminal portion are together formed.

For example, a stacked structure of the gate electrode layer 101 is preferably a two-layer structure where a molybdenum layer is stacked over an aluminum layer, a two-layer structure where a molybdenum layer is stacked over a copper layer, a two-layer structure where a titanium nitride layer or a tantalum nitride layer is stacked over a copper layer, or a two-layer structure where a titanium nitride layer and a molybdenum layer are stacked. Alternatively, a stacked structure where a copper oxide layer including Ca which is to be a barrier layer is stacked over a copper layer including Ca, or a stacked structure where a copper oxide layer including Mg which is to be a barrier layer is stacked over a copper layer including Mg can be given. As a three-layer structure, a stacked structure where a tungsten layer or a tungsten nitride layer, an alloy of aluminum and silicon or an alloy of aluminum and titanium, and a titanium nitride layer or a titanium layer are stacked is preferable.

Next, the gate insulating layer 102 covering the gate electrode layer 101 is formed. The gate insulating layer 102 is formed to have a thickness of 50 nm to 400 nm by a sputtering method, a PCVD method, or the like.

For example, for the gate insulating layer 102, a 100-nm-thick silicon oxide film is formed by a sputtering method. It is needless to say that the gate insulating layer 102 is not limited to such a silicon oxide film. The gate insulating layer 102 may be formed with a single layer or a stacked layer using any of insulating films such as a silicon oxynitride film, a silicon nitride film, an aluminum oxide film, an aluminum nitride film, an aluminum oxynitride film, and a tantalum oxide film. In the case of having a stacked structure, for example, a silicon nitride film may be formed by a PCVD method, and a silicon oxide film may be formed by a sputtering film thereover. In the case where a silicon oxynitride film, a silicon nitride film, or the like is used as the gate insulating layer 102, an impurity from the glass substrate, sodium for example, can be blocked from diffusing into and entering an oxide semiconductor to be formed later above the gate insulating layer 102.

Next, an oxide semiconductor film including $SiO_x$ is formed over the gate insulating layer 102. The oxide semiconductor film is formed with use of an oxide semiconductor target containing In (indium), Ga (gallium), and Zn (zinc), in which $SiO_2$ is included at 2 wt %. Inclusion of $SiO_x$ in an oxide semiconductor makes an oxide semiconductor film to be formed easy to be amorphous. In addition, when heat treatment is performed in a process after formation of the oxide semiconductor film, the oxide semiconductor film including $SiO_x$ can be prevented from being crystallized.

Next, an oxynitride film which does not include $SiO_x$ is formed over the oxide semiconductor film including $SiO_x$ by a sputtering method. Sputtering is performed in an atmosphere containing a nitrogen gas with use of an oxide semiconductor target containing Sn (tin) and Zn (zinc) ($SnO_2$:ZnO=1:1), so that a Sn—Zn—O—N-based non-single-crystal film is formed.

Examples of a sputtering method include an RF sputtering method in which a high-frequency power source is used as a sputtering power source, a DC sputtering method, and a pulsed DC sputtering method in which a bias is applied in a pulsed manner.

In addition, there is a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are also a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering method in which a voltage is also applied to a substrate during deposition.

Next, a photolithography step is performed. A resist mask is formed, and the Sn—Zn—O—N-based non-single-crystal film is selectively ethed. Then, with use of the same mask, the In—Ga—Zn—O-based non-single-crystal film including $SiO_x$ is selectively etched. After etching, the resist mask is removed.

Next, a photolithography step is performed. A new resist mask is formed, and an unnecessary portion (part of the gate insulating layer) is removed by etching, so that a contact hole which reaches an electrode layer or a wiring formed of the same material as the gate electrode layer is formed. This contact hole is provided for direct contact with a conductive film formed later. For example, in a driving circuit portion, a contact hole is formed when a thin film transistor whose gate electrode layer is direct contact with the source or drain electrode layer or a terminal that is electrically connected to a gate wiring of a terminal portion is formed. Note that an example of forming the contact hole for direct connection with the conductive film to be formed later by the photolithography step is described, but there is no particular limitation. A contact hole reaching the gate electrode layer may be formed later in the same step as the step in which a contact hole for connection to a pixel electrode may be formed, and electrical connection may be performed with use of the same material as the pixel electrode. When the electrical connection is performed with use of the same material as the pixel electrode, the number of masks can be reduced by one.

Then, a conductive film made of a metal material is formed over the Sn—Zn—O—N-based non-single-crystal film by a sputtering method or a vacuum evaporation method.

As the material of the conductive film, there are an element selected from Al, Cr, Ta, Ti, Mo, and W, an alloy containing any of these elements, an alloy film containing a combination of any of these elements, and the like. Further, in the case of performing heat treatment at 200° C. to 600° C. later, the conductive film preferably has heat resistance against such heat treatment. Since use of Al alone brings disadvantages such as low resistance and being easily corroded, aluminum is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), neodymium (Nd), and scandium (Sc), an alloy containing any of these above elements, an alloy film containing these elements in combination, and a nitride containing any of these above elements as a component.

In this embodiment, the conductive film has a single-layer structure of a titanium film. Alternatively, the conductive film may have a two-layer structure where a titanium film is stacked over an aluminum film. Still alternatively, the conductive film may have a three-layer structure where a Ti film, an aluminum film including Nd (Al—Nd) is stacked over the Ti film, and a Ti film is formed thereover. The conductive film may have a single-layer structure of an aluminum film including silicon.

Next, a photolithography step is performed. A resist mask is formed, and unnecessary portions are removed by etching, so that the source and drain electrode layers 105a and 105b and the source and drain regions 104a and 104b are formed in the pixel portion and source and drain electrode layers and source and drain regions are formed in the driver circuit portion. An etching method at this time is wet etching or dry etching. For example, when an aluminum film or an aluminum-alloy film is used as the conductive film, wet etching using a mixed solution of phosphoric acid, acetic acid, and nitric acid can be carried out. Here, the conductive film that is a Ti film is etched by wet etching, so that the source and drain electrode layers are formed, and the Sn—Zn—O—N-based non-single-crystal film is etched, so that the source and drain regions 104a and 104b are formed. In this etching step, an exposed region of the oxide semiconductor film including $SiO_x$ is also partly etched, so that the oxide semiconductor layer 103 including $SiO_x$ is formed.

In addition, in this photolithography step, a second terminal 122 formed from the same material as the source and drain electrode layers 105a and 105b is also left in the terminal portion. Note that the second terminal 122 is electrically connected to a source wiring (a source wiring including the source or drain electrode layer 105a or 105b).

Through the above steps, the thin film transistor 170 in which the oxide semiconductor layer 103 including $SiO_x$ serves as a channel formation region can be formed in the pixel portion.

In addition, in the terminal portion, a connection electrode 120 is directly connected to the first terminal 121 of the terminal portion through a contact hole formed in the gate insulating film. Note that although not illustrated in this embodiment, a source or drain wiring of the thin film transistor of the driver circuit is directly connected to the gate electrode through the same steps as the above-described steps.

Then, heat treatment (including photo-annealing) is performed at 200° C. to 600° C., and typically, 300° C. to 500° C. Here, heat treatment is performed in a nitrogen atmosphere in a furnace at 350° C. for one hour. Through this heat treatment, rearrangement at the atomic level occurs in the In—Ga—Zn—O-based non-single-crystal film including $SiO_x$. In addition, the oxide semiconductor layer 103 including $SiO_x$ can be prevented from being crystallized in heat treatment because of inclusion of $SiO_x$; thus the oxide semiconductor layer 103 can keep an amorphous structure. Note that there is no particular limitation on when to perform the heat treatment, as long as it is performed after the Sn—Zn—O—N-based non-single-crystal film is formed. For example, the heat treatment may be performed after a pixel electrode is formed.

Next, the resist mask is removed, and the protective insulating layer 106 is formed to cover the thin film transistor 170.

Then, a photolithography step is performed. A resist mask is formed, and the protective insulating layer 106 is etched, so that a contact hole reaching the source or drain electrode layer 105b is formed. In addition, a contact hole reaching the second terminal 122 and a contact hole reaching the connection electrode 120 are also formed by this etching.

After that, the resist mask is removed, and then a transparent conductive film is formed. The transparent conductive film is formed using indium oxide ($In_2O_3$), indium tin oxide ($In_2O_3$—$SnO_2$, abbreviated to ITO), or the like by a sputtering method, a vacuum evaporation method, or the like. Etching treatment of such a material is performed with a hydrochloric acid based solution. However, since a residue is easily generated particularly in etching ITO, indium oxide-zinc oxide alloy ($In_2O_3$—$ZnO$) may be used to improve etching processability.

Next, a photolithography step is performed. A resist mask is formed, and an unnecessary portion is removed by etching, so that a pixel electrode layer 110 is formed. In this photolithography step, a storage capacitor is formed by the capacitor wiring 108 and the pixel electrode layer 110 using the gate insulating layer 102 and the protective insulating layer 106 in the capacitor portion as a dielectric. Furthermore, in this photolithography step, the first terminal and the second terminal are covered with the resist mask so that transparent conductive films 128 and 129 remain in the terminal portion. The transparent conductive films 128 and 129 serve as electrodes or wirings that are used for connection with an FPC. The transparent conductive film 128 formed over the connection electrode 120 that is directly connected to the first terminal 121 serves as a terminal electrode for connection which functions as an input terminal for the gate wiring. The transparent conductive film 129 formed over the second terminal 122 serves as a terminal electrode for connection which functions as an input terminal for the source wiring.

Note that, in this embodiment, an example in which the storage capacitor is formed by the capacitor wiring 108 and the pixel electrode layer 110 using the gate insulating layer 102 and the protective insulating layer 106 as the dielectrics is described; however, there is no particular limitation. A structure may also be employed, in which an electrode including the same material as the source and drain electrodes is provided above the capacitor wiring and a storage capacitor is formed by the electrode and the capacitor wiring using the gate insulating layer 102 therebetween as a dielectric, and the electrode and the pixel electrode layer are electrically connected.

Figure 3:
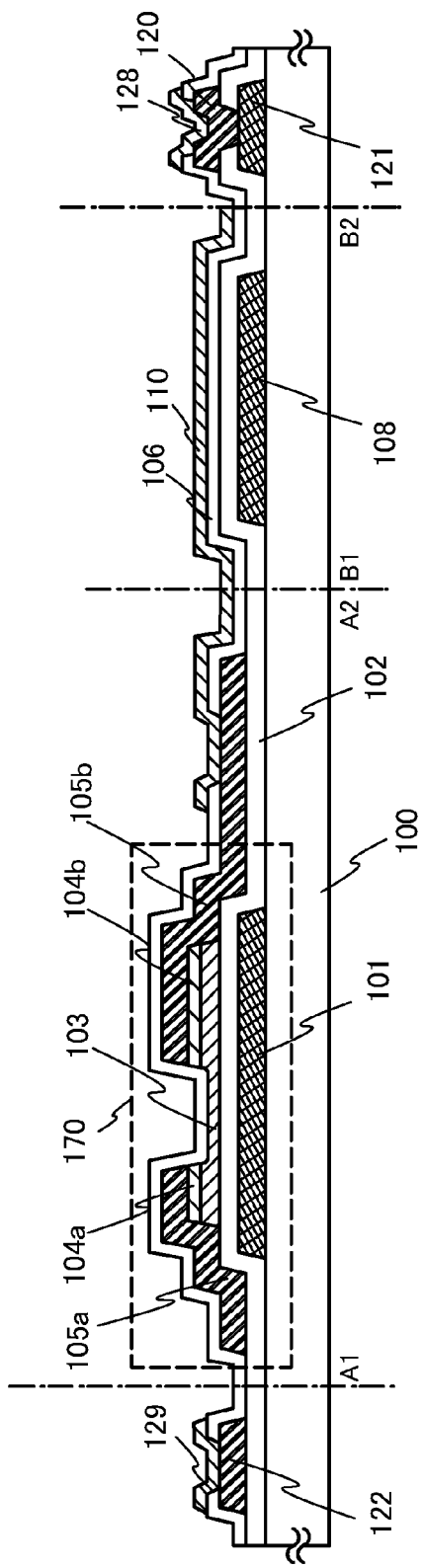
FIG. 3 is a cross-sectional view illustrating an embodiment of the present invention.

Then, the resist mask is removed. FIG. 3 is a cross-sectional view at this stage. Note that, a top view of the thin film transistor 170 in the pixel portion at this stage corresponds to FIG. 4.

Figure 4:
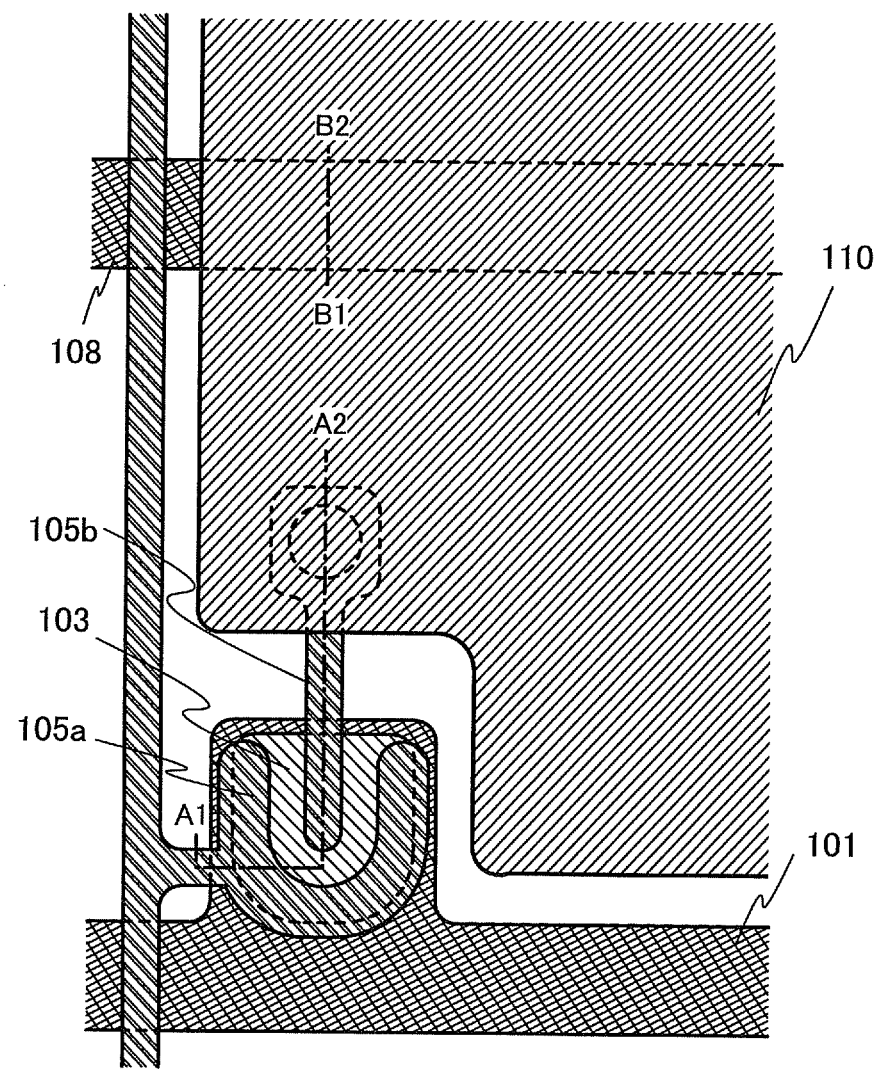
FIG. 4 is a top view illustrating an embodiment of the present invention.

A cross-sectional view taken along line A1-A2 and line B1-B2 of FIG. 4 corresponds to FIG. 3. FIG. 3 illustrates a cross-sectional structure of the thin film transistor 170 in the pixel portion, a cross-sectional structure of a capacitor portion in the pixel portion, and a cross-sectional structure of the terminal portion.

Further, FIGS. 5A and 5B are a cross-sectional view of a source wiring terminal portion and a top view thereof, respectively. FIG. 5A is a cross-sectional view taken along line D1-D2 of FIG. 5B. In FIG. 5A, a transparent conductive film 155 formed over a protective insulating layer 106 is a connection terminal electrode which functions as an input terminal. Furthermore, in FIG. 5A, in the terminal portion, an electrode 156 formed from the same material as the gate wiring is located below and overlapped with a second terminal 150, which is electrically connected to the source wiring, with a gate insulating layer 152 interposed therebetween. The electrode 156 is not electrically connected to the second terminal 150. When the electrode 156 is set to, for example, floating, GND, or 0 V such that the potential of the electrode 156 is different from the potential of the second terminal 150, a capacitor for preventing noise or static electricity can be formed. The second terminal 150 is electrically connected to the transparent conductive film 155 with the protective insulating layer 106 interposed therebetween.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. There is no particular limitation on the number of each of the terminals, and the number of the terminals may be determined by a practitioner as appropriate.

Thus, the pixel portion which includes the thin film transistor 170 including an oxide semiconductor layer including $SiO_x$ and the storage capacitor; and the terminal portion can be completed. In addition, a driver circuit can be formed over the same substrate.

When an active matrix liquid crystal display device is manufactured, an active matrix substrate and a counter substrate provided with a counter electrode are bonded to each other with a liquid crystal layer interposed therebetween. Note that a common electrode is provided over the active matrix substrate to be electrically connected to the counter electrode provided on the counter substrate, and a terminal is provided in a terminal portion to be electrically connected to the common electrode. This terminal is provided for setting the common electrode at a fixed potential such as GND or 0 V.

Figure 6:
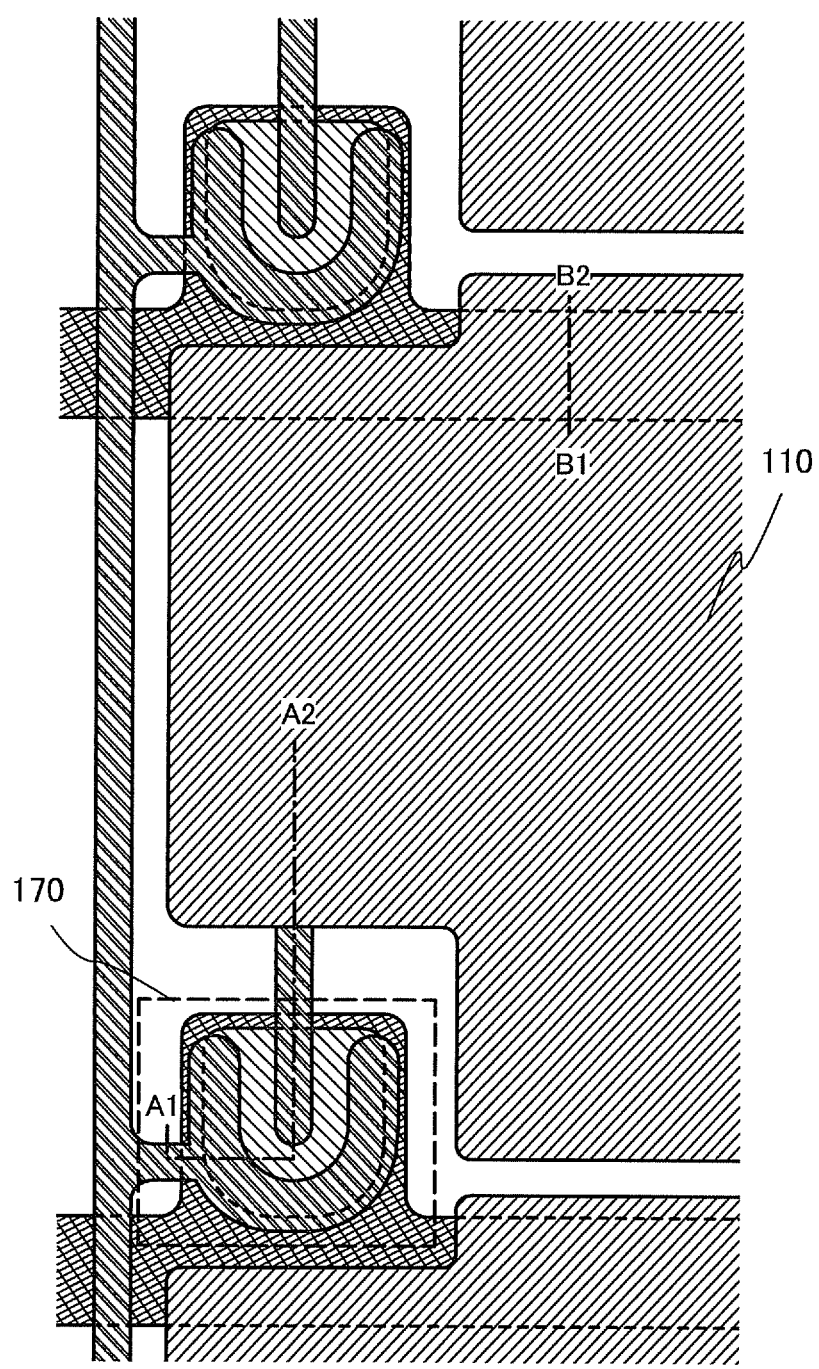
FIG. 6 is a top view illustrating an embodiment of the present invention.

Further, in this embodiment, a pixel structure is not limited to that of FIG. 4. An example of a top view different from FIG. 4 is illustrated in FIG. 6. FIG. 6 illustrates an example in which a capacitor wiring is not provided but a pixel electrode overlaps with a gate wiring of an adjacent pixel, with a protective insulating film and a gate insulating layer therebetween to form a storage capacitor. In that case, a capacitor wiring and a third terminal which is connected to the capacitor wiring can be omitted. Note that in FIG. 6, the same portions as those in FIG. 4 are denoted by the same reference numerals.

In an active matrix liquid crystal display device, display patterns are formed on a screen by driving pixel electrodes arranged in a matrix. In more detail, when voltage is applied between a selected pixel electrode and a counter electrode that corresponds to the selected pixel electrode, a liquid crystal layer provided between the pixel electrode and the counter electrode is optically modulated, and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of the liquid crystal display device, a driving method called black insertion is employed in which black is displayed on the whole screen every other frame period.

Moreover, a driving method called double-frame rate driving may be employed in which the vertical synchronizing frequency is 1.5 times or more, preferably twice or more as high as a conventional vertical synchronizing frequency so as to improve the moving-image characteristics.

Further alternatively, in order to improve the moving-image characteristics of a liquid crystal display device, a driving method may be employed in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

According to this embodiment, a display device having high electrical characteristics and high reliability can be provided at low costs.

This embodiment can be freely combined with Embodiment 1.

Embodiment 3

In this embodiment, an example in which light exposure using a multi-tone mask is performed so that the number of masks is reduced is described.

In addition, described is an example in which indium that is a rare metal the amount of production of which is limited is not used in the composition of an oxide semiconductor layer. In addition, described is an example in which gallium that is one kind of rare metal is also not used as a compositional element of an oxide semiconductor layer.

A multi-tone mask can achieve three levels of light exposure: an exposed portion, a half-exposed portion, and an unexposed portion. Light has a plurality of intensity levels by passing through the multi-tone mask. One-time light exposure and development process enables a resist mask with regions with a plurality of thicknesses (typically, two levels of thickness) to be formed. Accordingly, by using a multi-tone mask, the number of light-exposure masks can be reduced.

As typical examples of a multi-tone mask, there are a gray-tone mask, a half-tone mask, and the like.

A gray-tone mask includes a light-transmitting substrate, and a light-shielding portion and a diffraction grating which are formed over the light-transmitting substrate. The light transmittance of the light-shielding portion is 0%. On the other hand, the light transmittance of the diffraction grating can be controlled by setting an interval between light-transmitting portions in slit forms, dot forms, or mesh forms to an interval less than or equal to the resolution limit of light used for the exposure. Note that the diffraction grating can be either in a regular slit form, a regular dot form, or a regular mesh form, or in an irregular slit form, an irregular dot form, or an irregular mesh form.

A half-tone mask includes a light-transmitting substrate, and a semi-transmissive portion and a light-shielding portion which are formed over the light-transmitting substrate. The semi-transmissive portion can be formed using MoSiN, MoSi, MoSiO, MoSiON, CrSi, or the like. The light-shielding portion can be formed using a light-shielding material which absorbs light, such as chromium or chromium oxide. When the half-tone mask is irradiated with light for exposure, the light transmittance of the light-shielding portion is 0% and the light transmittance of a region where neither the light-shielding portion nor the semi-transmissive portion is provided is 100%. The light transmittance of the semi-transmissive portion can be controlled in the range of 10% to 70%. The light transmittance of the semi-transmissive portion can be controlled by the material of the semi-transmissive portion.

FIGS. 12A to 12E correspond to cross-sectional views illustrating steps for manufacturing a thin film transistor 360.

Figure 12A:
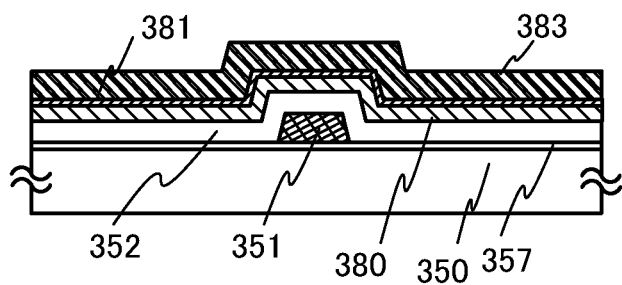
FIGS. 12A to 12E are cross-sectional views illustrating manufacturing steps of an embodiment of the present invention.

In FIG. 12A, an insulating film 357 is provided over a substrate 350 and a gate electrode layer 351 is provided thereover. In this embodiment, a silicon oxide film (with a thickness of 100 nm) is used as the insulating film 357. Over the gate electrode layer 351, a gate insulating layer 352, an oxide semiconductor film 380 including $SiO_x$, an oxynitirde film 381, and a conductive film 383 are stacked in this order. In this embodiment, an oxide semiconductor containing neither of indium and gallium, typically a Sn—Zn—O-based oxide semiconductor, or a Zn—O-based oxide semiconductor is used as the oxide semiconductor film 380 including $SiO_x$. In this embodiment, a Sn—Zn—O-based oxide semiconductor formed by a sputtering method is used as the oxide semiconductor film 380 including $SiO_x$, and a Sn—Zn—O-based oxynitride material is used as the oxynitride film 381 which does not include $SiO_x$.

Next, a mask 384 is formed over the gate insulating layer 352, the oxide semiconductor film 380 including $SiO_x$, the oxynitride film 381, and the conductive film 383.

In this embodiment, an example is described in which light exposure using a multi-tone (high-tone) mask is performed to form the mask 384.

Figure 12B:
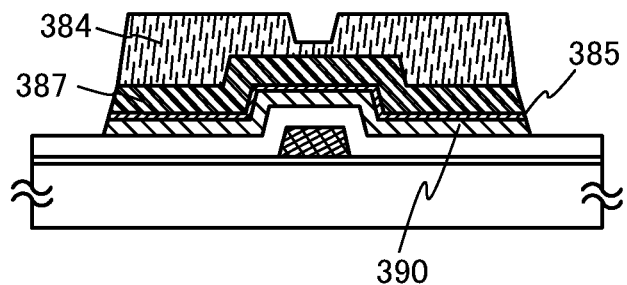
Figure 12C:
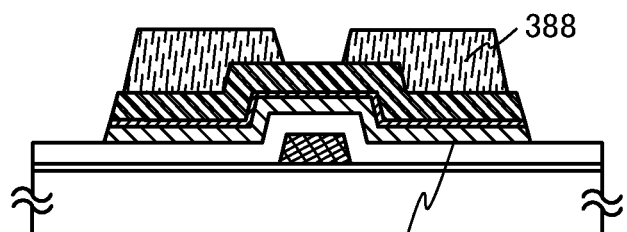

The light exposure is performed using the multi-tone mask through which light has a plurality of intensity levels, and then development is performed, whereby the mask 384 having regions with different levels of thickness can be formed as shown in FIG. 12B. The number of light-exposure masks can be reduced by using a multi-tone mask.

Next, a first etching step is performed using the mask 384 to etch the oxide semiconductor film 380 including $SiO_x$, the oxynitirde film 381, and the conductive film 383 into an island shape. Accordingly, a patterned oxide semiconductor layer 390 including $SiO_x$, a patterned oxynitride layer 385, and a patterned conductive layer 387 can be formed (see FIG. 12B).

Next, ashing is conducted on the mask 384. As a result, the area and thickness of the mask are reduced. At this time, the resist of the mask in a region with a small thickness (a region overlapping with part of the gate electrode layer 351) is removed, and divided masks 388 can be formed (see FIG. 12C).

Figure 12D:
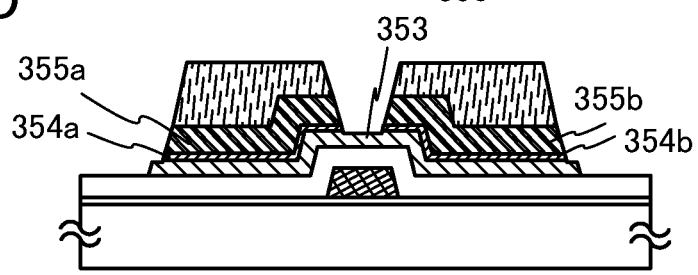

A second etching step is performed using the masks 388 to etch the oxynitride layer 385 and the conductive layer 387, so that a semiconductor layer 353 including $SiO_x$, source and drain regions 354a and 354b, and source and drain electrode layers 355a and 355b are formed (see FIG. 12D). Note that the semiconductor layer 353 including $SiO_x$ is partly etched to become a semiconductor layer having a groove (depression) and also having an end portion which is partly etched and exposed to outside.

When the first etching step is performed on the oxynitride film 381 and the conductive film 383 by dry etching, the oxynitirde film 381 and the conductive film 383 are etched anisotropically, which makes the end portions of the mask 384 and the end portions of the oxynitride layer 385 and the conductive layer 387 to be aligned with each other so as to become continuous.

Similarly, when the second etching step is performed on the oxynitride layer 385 and the conductive layer 387 by dry etching, the oxynitride layer 385 and the conductive layer 387 are etched anisotropically, which makes the end portions of the masks 388, an end portion of the depression, end portions in the etched region of the oxide semiconductor layer 353 including $SiO_x$, end portions of the source and drain regions 354a and 354b, and end portions of the source and drain electrode layers 355a and 355b to be aligned with each other so as to become continuous.

Shown in this embodiment is the case where the semiconductor layer 353 including $SiO_x$ and the source and drain electrode layers 355a and 355b have the same tapered angle at the respective end portions and are stacked so that the end portions are continuous. However, since the etching rates thereof are different depending on the etching condition and the materials of the oxide semiconductor layer and the conductive layer, the tapered angles may be different and the end portions is not necessarily continuous.

After that, the masks 388 are removed.

Figure 12E:
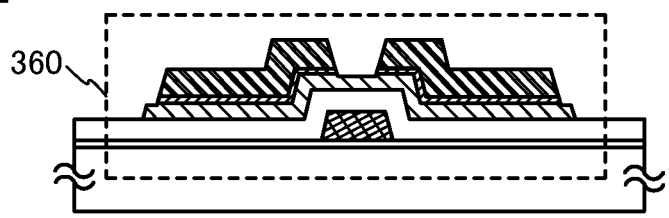

Next, heating is performed at 200° C. to 600° C. in an atmosphere containing oxygen is performed (see FIG. 12E). The semiconductor layer 353 includes $SiO_x$ which hinders crystallization; thus, the semiconductor layer including $SiO_x$ can keep the amorphous state even after heating at 200° C. to 600° C.

Through the above process, the channel-etch type thin film transistor 360 including the semiconductor layer 353 including $SiO_x$ can be manufactured.

The use of a resist mask having regions with a plurality of thicknesses (typically, two levels of thickness) formed using a multi-tone mask as in this embodiment enables the number of resist masks to be reduced, which leads to simplification of the manufacturing process and cost reduction.

Further, indium and gallium are not used in the oxide semiconductor layer including $SiO_x$ or the oxynitride layer as described in this embodiment, thereby reducing the cost for a target of an oxide semiconductor, which leads to cost reduction.

Accordingly, a semiconductor device can be manufactured at low cost with high productivity.

Embodiment 4

Figure 13A:
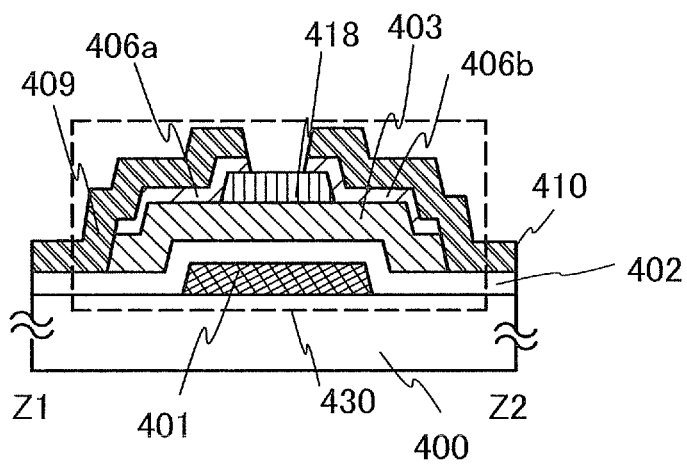
FIGS. 13A and 13B are a cross-sectional view and a top view, respectively, illustrating an embodiment of the present invention.
Figure 13B:
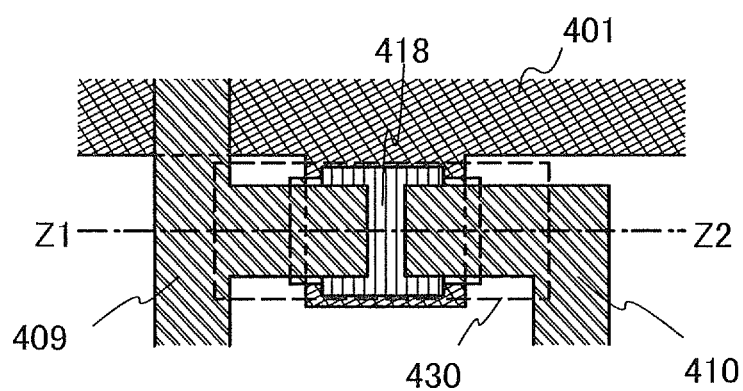

In this embodiment, an example of a channel stop type thin film transistor 430 is described using FIGS. 13A and 13B. FIG. 13B illustrates an example of a top view of a thin film transistor, cross-sectional view along dotted line Z1-Z2 of which corresponds to FIG. 13A. Described is an example in which an oxide semiconductor material which dies not contain indium is used in an oxide semiconductor layer in the thin film transistor 430.

In FIG. 13A, a gate electrode 401 is provided over a substrate 400. Then, over a gate insulating layer 402 covering the gate electrode 401, an oxide semiconductor layer 403 including $SiO_x$ is provided.

In this embodiment, a Ga—Zn—O-based oxide semiconductor formed by a sputtering method is used as the oxide semiconductor layer 403 including $SiO_x$. In this embodiment, the oxide semiconductor layer 403 including $SiO_x$ is formed using an oxide semiconductor which does not contain indium, typically, a Ga—Sn—Zn—O-based, Ga—Zn—O-based, Sn—Zn—O-based, Ga—Sn—O-based or Zn—O-based oxide semiconductor which does not contain indium.

Next, a channel protective layer 418 is provided so as to be in contact with and over the oxide semiconductor layer 403 including $SiO_x$. The channel protective layer 418 is provided, whereby damage to a channel formation region in the oxide semiconductor layer 403 including $SiO_x$, which is caused in the manufacturing process (reduction in film thickness due to plasma or etchant in etching, oxidation, etc.), can be prevented. Accordingly, the reliability of the thin film transistor 430 can be improved.

The channel protective layer 418 can be formed using an inorganic material (such as silicon oxide, silicon nitride, silicon oxynitride, or silicon nitride oxide). As a manufacturing method of the channel protective layer 418, a vapor phase growth method such as a plasma CVD method or a thermal CVD method, or a sputtering method can be used. The shape of the channel protective layer 418 is processed after the film deposition. In this embodiment, a silicon oxide film is deposited by a sputtering method and processed by etching using a mask formed by photolithography, so that the channel protective layer 418 is formed.

Next, source and drain regions 406a and 406b are formed over the channel protective layer 418 and the oxide semiconductor layer 403 including $SiO_x$. In this embodiment, the source and drain regions 406a and 406b are formed using a Ga—Zn—O—N-based non-single-crystal film is used. Alternatively, the source and drain regions 406a and 406b may be formed using a Zn—O-based non-single-crystal film including nitrogen, that is, a Zn—O—N non-single-crystal film.

Next, a first wiring 409 and a second wiring 410 are formed over the source and drain regions 406a and 406b. The first wiring 409 and the second wiring 410 are formed using an element selected from Al, Cr, Ta, Ti, Mo, and W, an alloy containing any of these elements, an alloy film containing a combination of any of these elements, or the like.

By the provision of the source and drain regions 406a and 406b, the first wiring 409 and the second wiring 410 which are metal layers can have a good junction with the oxide semiconductor layer 403 including $SiO_x$, so that stable operation can be realized in terms of heat in comparison with a Schottky junction. In addition, it is effective that the source and drain regions 406a and 406b are provided in order that carriers of a channel are supplied (on the source side), that carriers of a channel are absorbed stably (on the drain side), or that a resistive component is not produced in an interface between a wiring and an oxide semiconductor layer.

Next, heat treatment is preferably performed at 200° C. to 600° C., typically, 300° C. to 500° C. Here, heat treatment is performed in a furnace at 350° C. for one hour in an air atmosphere. Through this heat treatment, rearrangement at the atomic level occurs in the oxide semiconductor layer including $SiO_x$. Since strain energy which inhibits carrier movement is released by the heat treatment, the heat treatment (including optical annealing) is important. In addition, $SiO_x$ included in the oxide semiconductor layer 403 can prevent the oxide semiconductor layer 403 from being crystallized in heat treatment; thus, the oxide semiconductor layer 403 can keep the amorphous structure. There is no particular limitation on when to perform the heat treatment as long as it is performed after the formation of the oxide semiconductor layer 403 including $SiO_x$; for example, it can be performed after the formation of the pixel electrode.

Further, indium is not used in the oxide semiconductor layer as is in this embodiment, which leads to no use of indium that might be depleted as a material.

This embodiment can be combined with any of the other embodiments as appropriate.

Embodiment 5

In this embodiment, an example in which an inverter circuit is formed using two n-channel thin film transistors 760 and 761 is described. Described in this embodiment is an example in which gallium is not contained in each oxide semiconductor layer of the thin film transistors 760 and 761.

A driver circuit for driving a pixel portion is formed using an inverter circuit, a capacitor, a resistor, and the like. When two n-channel TFTs are combined to form an inverter circuit, there are two types of combinations: a combination of an enhancement type transistor and a depletion type transistor (hereinafter, a circuit formed by such a combination is referred to as an "EDMOS circuit") and a combination of enhancement type TFTs (hereinafter, a circuit formed by such a combination is referred to as an "EEMOS circuit"). Note that when the threshold voltage of the n-channel TFT is positive, the n-channel TFT is defined as an enhancement type transistor, while when the threshold voltage of the n-channel TFT is negative, the n-channel TFT is defined as a depletion type transistor; this definition is applied throughout the specification.

The pixel portion and the driver circuit are formed over the same substrate. In the pixel portion, ON/OFF of voltage application to a pixel electrode is switched using enhancement type transistors arranged in a matrix.

Figure 14A:
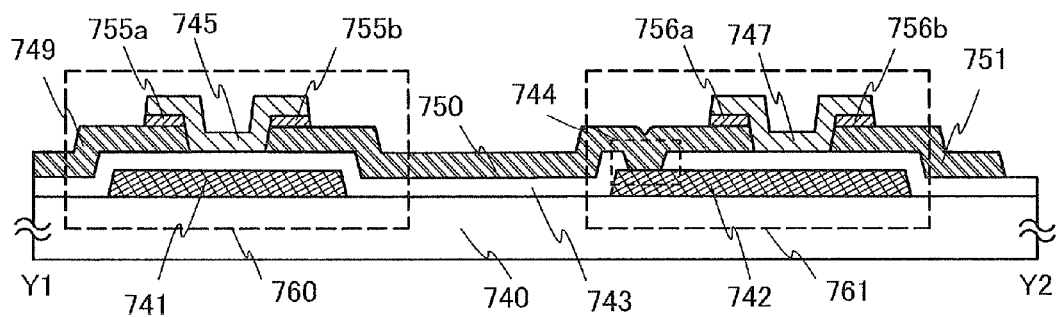
FIGS. 14A and 14B are a cross-sectional view and a top view, respectively, illustrating an embodiment of the present invention.

FIG. 14A illustrates a cross-sectional structure of the inverter circuit of the driver circuit. In FIG. 14A, a first gate electrode 741 and a second gate electrode 742 are provided over a substrate 740. The first gate electrode 741 and the second gate electrode 742 each can be formed to have a single-layer or stacked-layer structure using any of a metal material such as molybdenum, titanium, chromium, tantalum, tungsten, aluminum, copper, neodymium, or scandium, and an alloy material which contains any of these materials as a main component.

Further, a first wiring 749, a second wiring 750, and a third wiring 751 are provided over a gate insulating layer 743 that covers the first gate electrode 741 and the second gate electrode 742. The second wiring 750 is directly connected to the second gate electrode 742 through a contact hole 744 formed in the gate insulating layer 743.

Further, a source or drain region 755a is formed over the first wiring 749, a source or drain region 755b and a source or drain region 756a are formed over the second wiring 750, and a source or drain region 756b is formed over the third wiring 751. In this embodiment, the source and drain regions 755a and 755b and the source and drain regions 756a and 756b are formed using a Zn—O—N-based non-single-crystal film which does not include $SiO_x$. Alternatively, the source and drain regions 755a and 755b and the source and drain regions 756a and 756b may be formed using an In—Zn—O—N-based non-single-crystal film including nitrogen may be used.

Further, a first oxide semiconductor layer 745 including $SiO_x$ is provided in a position which overlaps with the first gate electrode 741 and which is over the first and second wirings 749 and 750 with the source and drain regions 755a and 755b interposed therebetween. A second oxide semiconductor layer 747 including $SiO_x$ is provided in a position which overlaps with the second gate electrode 742 and which is over the second and third wirings 750 and 751 with the source and drain regions 756a and 756b interposed therebetween.

In this embodiment, the first oxide semiconductor layer 745 including $SiO_x$ and the second oxide semiconductor layer 747 including $SiO_x$ are formed using an In—Zn—O-based oxide semiconductor by a sputtering method. For the first oxide semiconductor layer 745 including $SiO_x$ and the second oxide semiconductor layer 747 including $SiO_x$, an oxide semiconductor which does not contain gallium, typically, an In—Sn—Zn—O-based, In—Zn—O-based, In—Sn—O-based, Sn—Zn—O-based, or Zn—O-based oxide semiconductor, which does not contain gallium, is used.

The first thin film transistor 760 includes the first gate electrode 741 and the first oxide semiconductor layer 745 including $SiO_x$, which overlaps with the first gate electrode 741 with the gate insulating layer 743 interposed therebetween. The first wiring 749 is a power supply line at a ground potential (a ground power supply line). This power supply line at a ground potential may be a power supply line to which a negative voltage VDL is applied (a negative power supply line).

The second thin film transistor 761 includes the second gate electrode 742 and the second oxide semiconductor layer 747 including $SiO_x$ which overlaps with the second gate electrode 742 with the gate insulating layer 743 interposed therebetween. The third wiring 751 is a power supply line to which a positive voltage VDD is applied (a positive power supply line).

As illustrated in FIG. 14A, the second wiring 750 which is electrically connected to both the first oxide semiconductor layer 745 including $SiO_x$ and the second oxide semiconductor layer 747 including $SiO_x$ is directly connected to the second gate electrode 742 of the second thin film transistor 761 through the contact hole 744 formed in the gate insulating layer 743. Direct connection between the second wiring 750 and the second gate electrode 742 can provide good contact and reduce the contact resistance. In comparison with the case where the second gate electrode 742 and the second wiring 750 are connected to each other with a conductive film, e.g., a transparent conductive film, interposed therebetween, reduction in the number of contact holes and reduction in an area occupied by the driver circuit in accordance with the reduction in the number of contact holes can be achieved.

Figure 14B:
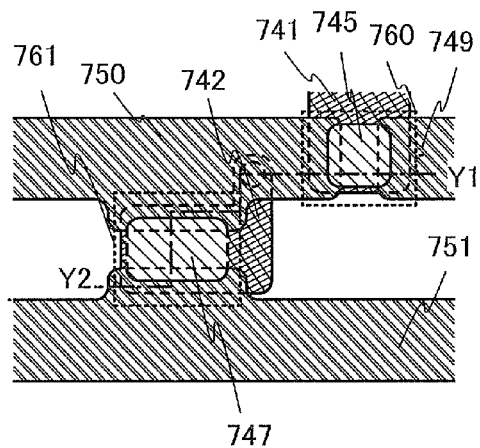

A top view of the inverter circuit of the driver circuit is illustrated in FIG. 14B. A cross section taken along dotted line Y1-Y2 in FIG. 14B corresponds to FIG. 14A.

As in this embodiment, gallium is not used in the oxide semiconductor layer, which leads to no use of gallium which is a high cost material.

This embodiment can be combined with any of the other embodiments as appropriate.

Embodiment 6

Figure 15A:
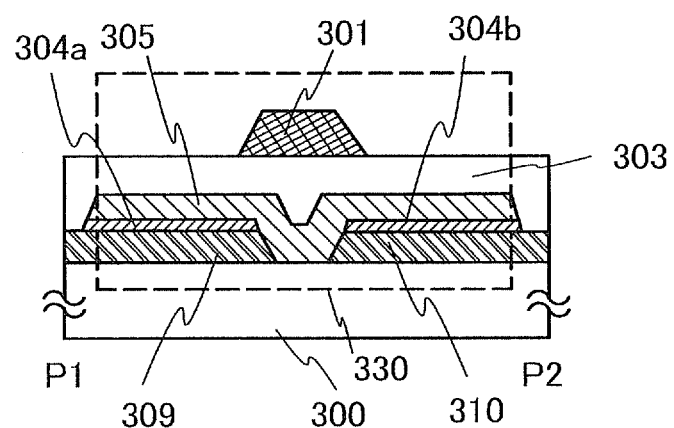
FIGS. 15A and 15B are a cross-sectional view and a top view, respectively, illustrating an embodiment of the present invention.
Figure 15B:
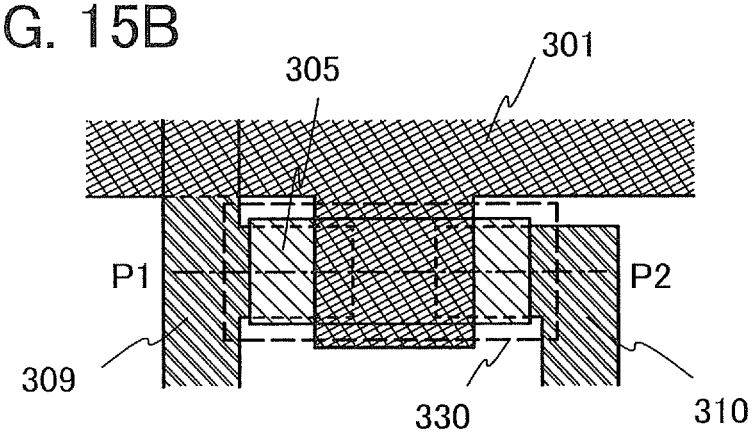

In this embodiment, an example of a top-gate type thin film transistor 330 is described reference to FIGS. 15A and 15B. FIG. 15B illustrates an example of a top view of a thin film transistor, a cross-sectional view along dotted line P1-P2 of which corresponds to FIG. 15A.

In FIG. 15A, over a substrate 300, a conductive film and an oxynitride film are stacked, and etching is performed, so that a first wiring 309 and a second wiring 310 are formed and oxynitride layers 304a and 304b are formed thereover. The first wiring 309 and the second wiring 310 serve as source and drain electrodes. The oxynitride layers 304a and 304b serve as source and drain regions and are formed using an In—Ga—Zn—O—N-based non-single-crystal film.

Next, an oxide semiconductor layer 305 including $SiO_x$ is formed so as to cover an exposed region of the substrate 300 and the oxynitride layers 304a and 304b. In this embodiment, the oxide semiconductor layer 305 including $SiO_x$ is formed using a Sn—Zn—O-based oxide semiconductor including $SiO_x$.

Next, a gate insulating layer 303 covering the oxide semiconductor layer 305, the first wiring 309m and the second wiring 310 is formed.

Next, heat treatment is preferably performed at 200° C. to 600° C., typically, 300° C. to 500° C. Here, heat treatment is performed in a furnace at 350° C. for one hour in an air atmosphere. Through this heat treatment, rearrangement at the atomic level occurs in the oxide semiconductor layer 305 including $SiO_x$. Since strain energy which inhibits carrier movement is released by the heat treatment, the heat treatment (including optical annealing) is important.

Next, a gate electrode 301 is provided in a position which is over the gate insulating layer 303 and overlaps with a region where the oxide semiconductor layer 305 including $SiO_x$ is in contact with the substrate 300.

Through the above process, the top-gate type thin film transistor 330 can be manufactured.

This embodiment can be combined with any of the other embodiments as appropriate.

Embodiment 7

Figure 16A:
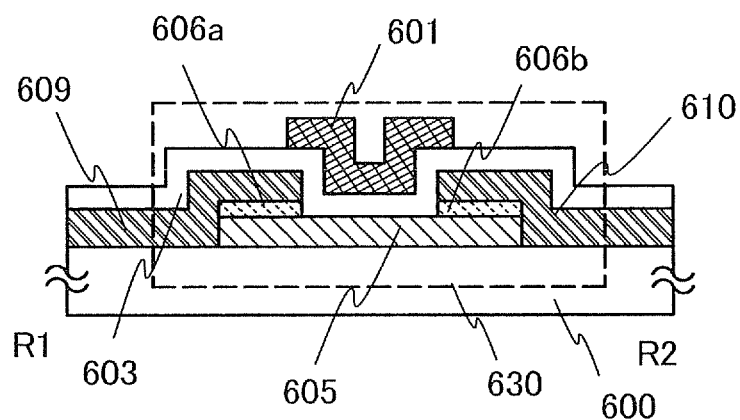
FIGS. 16A and 16B are a cross-sectional view and a top view, respectively, illustrating an embodiment of the present invention.
Figure 16B:
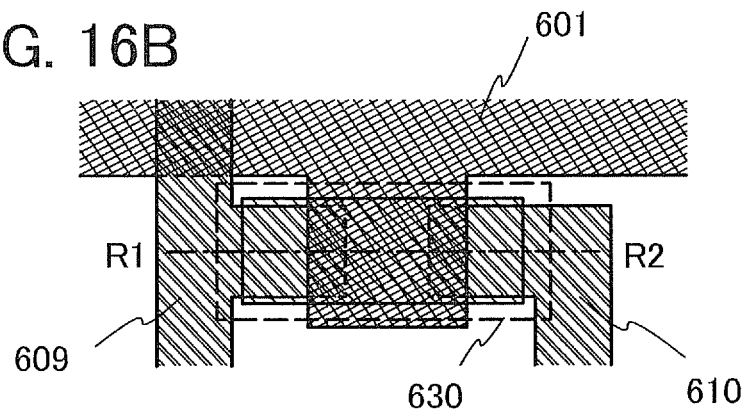

In this embodiment, an example of a top-gate type thin film transistor 630 is described reference to FIGS. 16A and 16B. FIG. 16B illustrates an example of a top view of a thin film transistor, a cross-sectional view along dotted line R1-R2 of which corresponds to FIG. 16A.

In FIG. 16A, an oxide semiconductor layer 605 including $SiO_x$ is formed over a substrate 600. In this embodiment, the oxide semiconductor layer 605 is formed using a Sn—Zn—O-based oxide semiconductor including $SiO_x$.

Next, source and drain regions 606a and 606b are formed over the oxide semiconductor layer 605. In this embodiment, the source and drain regions 606a and 606b are formed using a Ga—Zn—O-based non-single-crystal film. Alternatively, the source and drain regions 606a and 606b may be formed using a Ga—Zn—O-based non-single-crystal film including nitrogen, that is, a Ga—Zn—O—N-based non-single-crystal film (also called a GZON film).

Next, a first wiring 609 and a second wiring 610 are formed over the source and drain regions 606a and 606b. Note that the first and second wirings 609 and 612 serve as source and drain electrodes.

Then, a gate insulating layer 603 is formed over the first and second wirings 609 and 610.

Next, a gate electrode 601 is provided in a position which is over the gate insulating layer 603 and overlaps with a region where the oxide semiconductor layer 605 is in contact with the gate insulating layer 603.

Next, heat treatment is preferably performed at 200° C. to 600° C., typically, 300° C. to 500° C. Here, heat treatment is performed in a furnace at 350° C. for one hour in an air atmosphere. Through this heat treatment, rearrangement at the atomic level occurs in the oxide semiconductor layer 605. Since strain energy which inhibits carrier movement is released by the heat treatment, the heat treatment (including optical annealing) is important.

Through the above process, the top-gate type thin film transistor 630 can be manufactured.

Embodiment 8

An example is described below, in which at least part of a driver circuit and a thin film transistor arranged in a pixel portion are formed over the same substrate in a display device which is one example of a semiconductor device.

The thin film transistor arranged in the pixel portion is formed according to Embodiment 2, so that a channel formation region is formed using an oxide semiconductor layer including $SiO_x$ and source and drain regions are formed using an oxide semiconductor including nitrogen. The thin film transistor is formed to be an n-channel TFT, and thus part of a driver circuit that can be formed with an n-channel TFT is formed over the same substrate as the thin film transistor of the pixel portion.

Figure 17A:
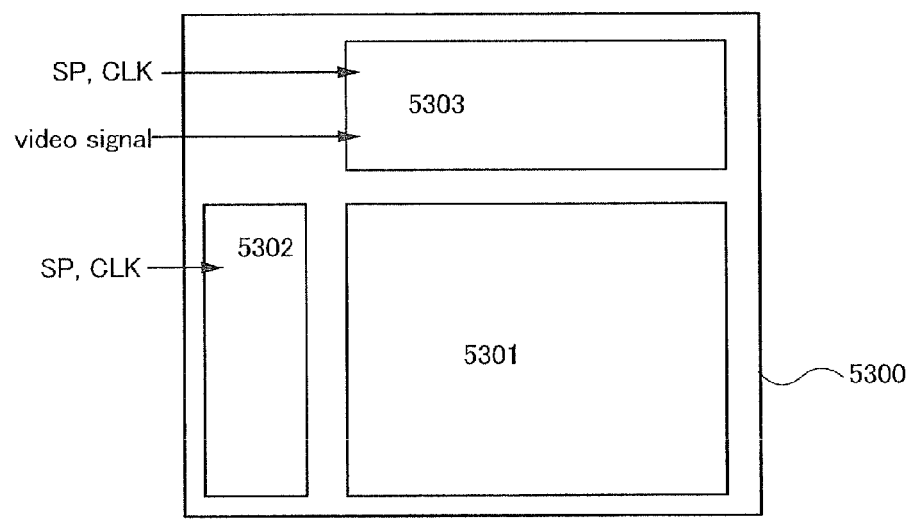
FIGS. 17A and 17B are each a block diagram of a semiconductor device illustrating an embodiment of the present invention.

FIG. 17A illustrates an example of a block diagram of an active matrix liquid crystal display device which is an example of a semiconductor device. The display device illustrated in FIG. 17A includes, over a substrate 5300, a pixel portion 5301 including a plurality of pixels that are each provided with a display element; a scan line driver circuit 5302 that selects a pixel; and a signal line driver circuit 5303 that controls a video signal input to the selected pixel.

In addition, the thin film transistor described in Embodiment 2 is an n-channel TFT, and a signal line driver circuit including the n-channel TFT is described with reference to FIG. 18.

Figure 18:
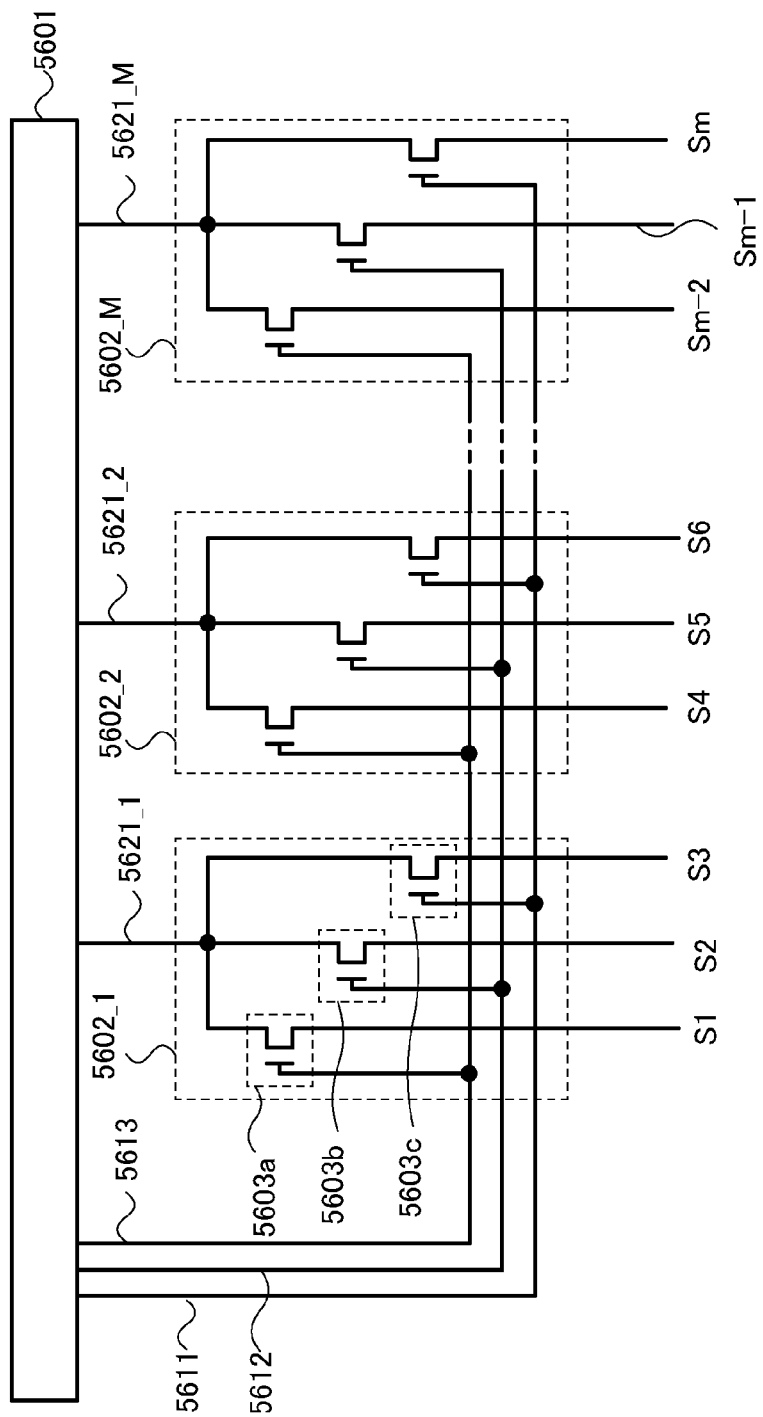
FIG. 18 is a configuration diagram of a signal line driver circuit illustrating an embodiment of the present invention.

The signal line driver circuit in FIG. 18 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The pixel portion 5301 is connected to the signal line driver circuit 5303 by a plurality of signal lines S1 to Sm (not shown) which extend in a column direction from the signal line driver circuit 5303, and to the scan line driver circuit 5302 by a plurality of scan lines G1 to Gn (not shown) that extend in a row direction from the scan line driver circuit 5302. The pixel portion 5301 includes a plurality of pixels (not shown) arranged in matrix so as to correspond to the signal lines S1 to Sm and the scan lines G1 to Gn. Each pixel is connected to a signal line Sj (one of the signal lines S1 to Sm) and a scan line Gi (one of the scan lines G1 to Gn).

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, the third wiring 5613, and the wirings 5621_1 to 5621_M are connected to the switch groups 5602_1 to 5602_M, respectively. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c which are included in the switch group 5602_J.

A signal is input to each of the first wiring 5611, the second wiring 5612, and the third wiring 5613.

Note that the driver IC 5601 is preferably formed over a single crystalline substrate. Further, the switch groups 5602_1 to 5602_M are preferably formed over the same substrate as the pixel portion is. Therefore, the driver IC 5601 and the switch groups 5602_1 to 5602_M are preferably connected through an FPC or the like.

Figure 19:
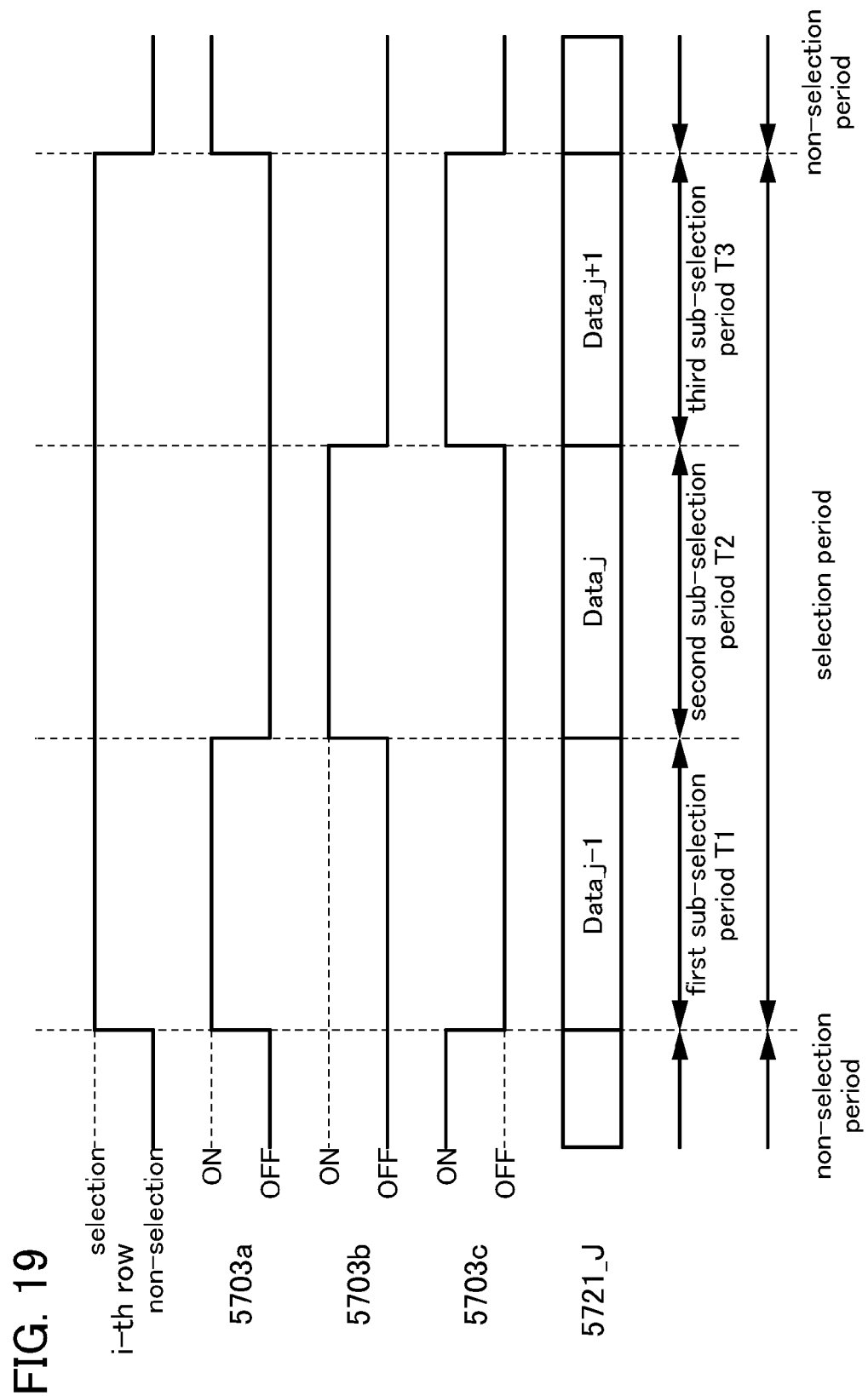
FIG. 19 is a timing chart of an operation of a signal line driver circuit illustrating an embodiment of the present invention.

Next, operation of the signal line driver circuit shown in FIG. 18 is described with reference to a timing chart in FIG. 19. The timing chart in FIG. 19 illustrates a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 18 operates similarly to that in FIG. 19 even when a scan line of another row is selected.

Note that the timing chart in FIG. 19 shows a case where the wiring 5621_J of the J-th column is connected to the signal line Sj−1, the signal line Sj, and the signal line Sj+1 via the first thin film transistor 5603a, the second thin film transistor 5603b, and the third thin film transistor 5603c.

The timing chart in FIG. 19 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_) in the third sub-selection period T3 is input to the signal line Sj+1. The video signals input to the wiring 5621_J in the first sub-selection period T1, the second sub-selection period T2, and the third sub-selection period T3 are denoted by Data_j−1, Data_j, and Data_j+1, respectively.

As illustrated in FIG. 19, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 18, by dividing one gate selection period into three, video signals can be input to three signal lines from one wiring 5621 during one gate selection period. Therefore, in the signal line driver circuit in FIG. 18, the number of connections between the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 18 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective sub-selection periods as illustrated in FIG. 18.

For example, when video signals are input to three or more signal lines from one wiring in three or more sub-selection periods, it is only necessary to add a thin film transistor and a wiring for controlling the thin film transistor. Note that when one selection period is divided into four or more sub-selection periods, one sub-selection period becomes short. Therefore, one selection period is preferably divided into two or three sub-selection periods.

Figure 20:
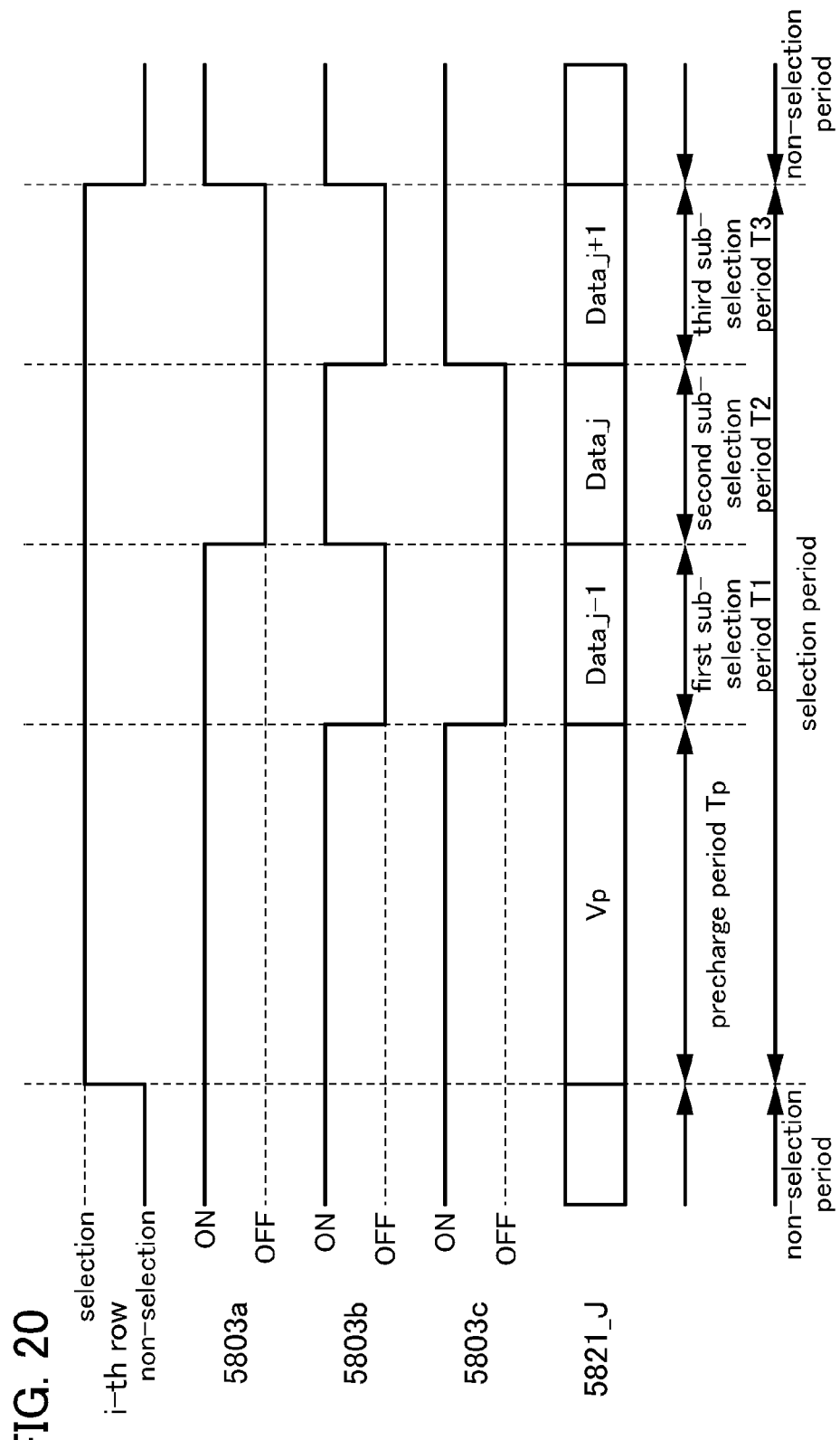
FIG. 20 is a timing chart of an operation of a signal line driver circuit illustrating an embodiment of the present invention.

As another example, one gate selection period may be divided into a pre-charge period Tp, the first sub-selection period T1, the second sub-selection period T2, and the third sub-selection period T3 as illustrated in a timing chart in FIG. 20. The timing chart in FIG. 20 shows the timing at which the scan line Gi of the i-th row is selected, timing 5803a at which the first thin film transistor 5603a is turned on/off, timing 5803b at which the second thin film transistor 5603b is turned on/off, timing 5803c at which the third thin film transistor 5603c is turned on/off, and a signal 5821_J input to the wiring 5621_J of the J-th column. As illustrated in FIG. 20, the first thin film transistor 5603a, the second thin film transistor 5603b, and the third thin film transistor 5603c are tuned on in the precharge period Tp. At this time, precharge voltage Vp input to the wiring 5621_J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 18 to which the timing chart in FIG. 20 is applied, the video signal can be written to the pixel at high speed because the signal line can be precharged by providing a precharge selection period before a sub-selection period. Note that portions in FIG. 20 which are similar to those of FIG. 19 are denoted by common reference numerals and detailed description of the portions which are the same and portions which have similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is produced. The selection signal produced is buffered and amplified by the buffer, and the resulting signal is supplied to a corresponding scan line. Gate electrodes of transistors in pixels of one line are connected to the scan line. Further, since the transistors in the pixels of one line have to be turned on at the same time, a buffer which can feed a large amount of current is used.

One mode of a shift register which is used for part of a scan line driver circuit is described with reference to FIG. 21 and FIG. 22.

Figure 21:
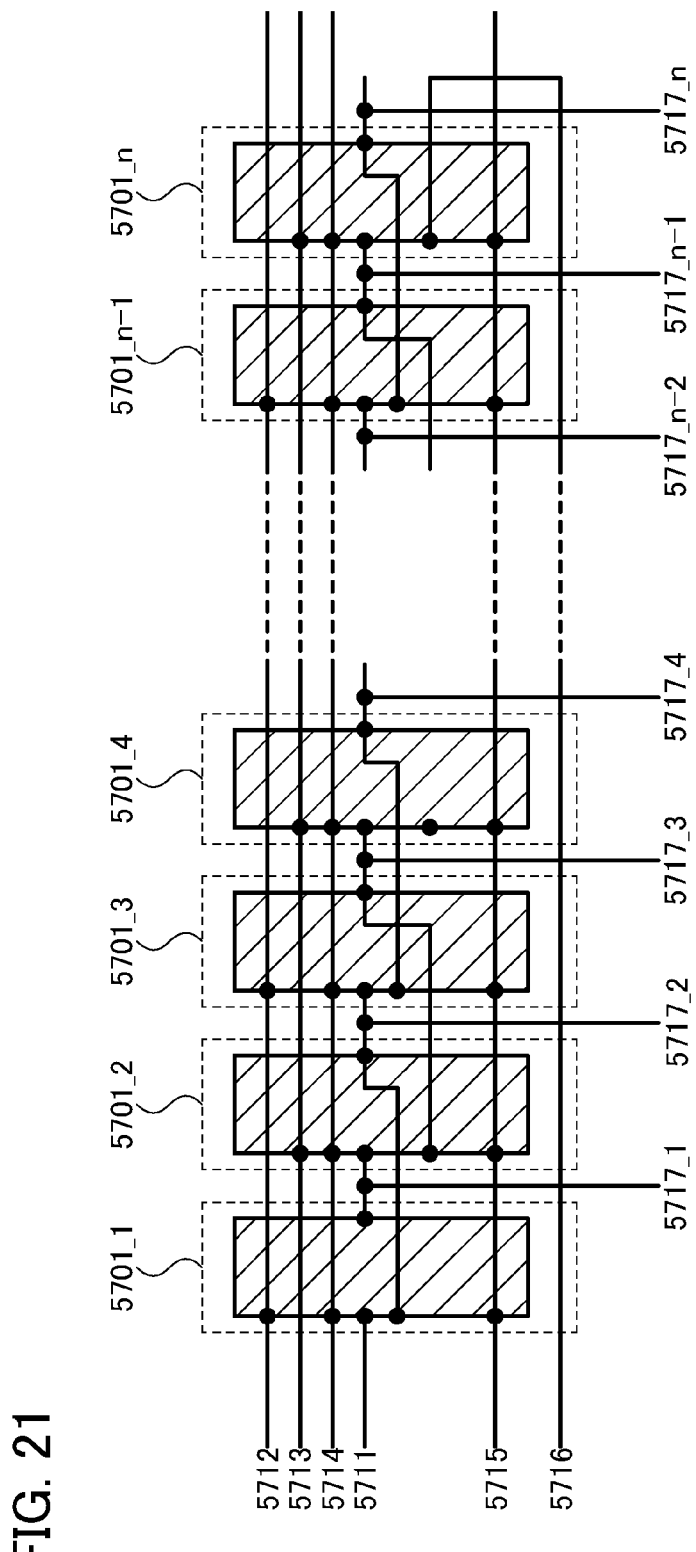
FIG. 21 is a diagram showing one example of a structure of a shift register illustrating an embodiment of the present invention.

FIG. 21 illustrates a circuit configuration of the shift register. The shift register illustrated in FIG. 21 includes a plurality of flip-flops, flip-flops 5701_1 to 5701_n. Further, the shift register operates by inputting a first clock signal, a second clock signal, a start pulse signal, and a reset signal.

Connection relations of the shift register in FIG. 21 are described. In the i-th stage flip-flop 5701_i (one of the flip-flops 5701_1 to 5701_n) in the shift register of FIG. 21, a first wiring 5501 illustrated in FIG. 22 is connected to a seventh wiring 5717_i−1; a second wiring 5502 illustrated in FIG. 22 is connected to a seventh wiring 5717_i+1; a third wiring 5503 illustrated in FIG. 22 is connected to a seventh wiring 5717_i; and a sixth wiring 5506 illustrated in FIG. 22 is connected to a fifth wiring 5715.

Figure 22:
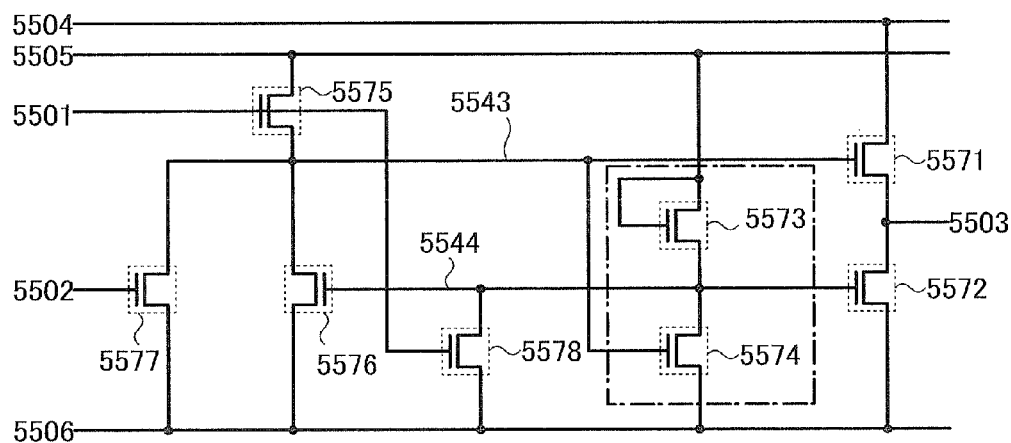
FIG. 22 is a diagram showing a connection structure of the flip-flop shown in FIG. 21.

Further, a fourth wiring 5504 illustrated in FIG. 22 is connected to a second wiring 5712 in flip-flops of odd-numbered stages, and is connected to a third wiring 5713 in flip-flops of even-numbered stages. A fifth wiring 5505 illustrated in FIG. 22 is connected to a fourth wiring 5714.

Note that the first wiring 5501 in FIG. 22, of the first stage flip-flop 5701_1 is connected to a first wiring 5711. Moreover, the second wiring 5502 in FIG. 22, of the n-th stage flip-flop 5701_n is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 22 illustrates details of the flip-flop illustrated in FIG. 21. A flip-flop illustrated in FIG. 22 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

In FIG. 22, a gate electrode of the third thin film transistor 5573 is electrically connected to the power supply line. Further, it can be said that a circuit in which the third thin film transistor 5573 is connected to the fourth thin film transistor 5574 (a circuit surrounded by the dotted line in FIG. 22) corresponds to a configuration illustrated in FIG. 14A. Although the example in which all the thin film transistors are enhancement type n-channel transistors is described here, there is no limitation to this example. For example, the driver circuit can be driven even with the use of an n-channel depletion-type transistor as the third thin film transistor 5573.

Next, connections of the flip-flop shown in FIG. 21 are described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505, and a second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving scan lines of even-numbered rows is provided on one side and a scan line driver circuit for driving scan lines of odd-numbered rows is provided on the opposite side; thus, increase in frame frequency can be realized. Furthermore, the use of the plurality of scan line driver circuits for output of signals to the same scan line have an advantage in increasing the size of a display device.

Figure 17B:
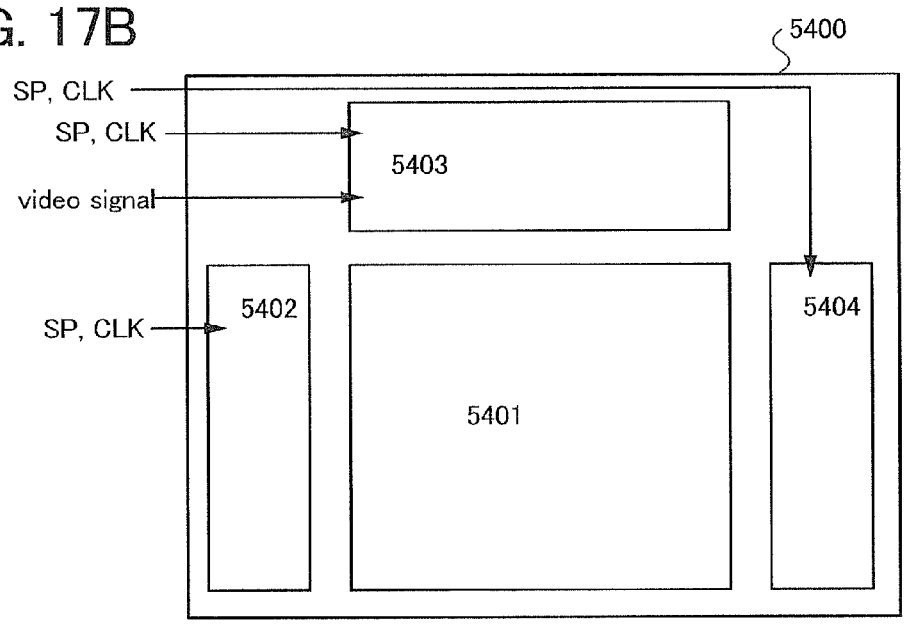

Further, when an active matrix light-emitting display device which is an example of a semiconductor device is manufactured, a plurality of thin film transistors are arranged in at least one pixel, and thus a plurality of scan line driver circuits are preferably arranged. FIG. 17B is a block diagram illustrating an example of an active matrix light-emitting display device.

The light-emitting display device illustrated in FIG. 17B includes, over a substrate 5400, a pixel portion 5401 having a plurality of pixels each provided with a display element, a first scan line driver circuit 5402 and a second scan line driver circuit 5404 that select a pixel, and a signal line driver circuit 5403 that controls input of a video signal to the selected pixel.

When the video signal input to a pixel of the light-emitting display device illustrated in FIG. 17B is a digital signal, a pixel is in a light-emitting state or in a non-light-emitting state by switching of ON/OFF of a transistor. Thus, grayscale can be displayed using an area ratio grayscale method or a time ratio grayscale method. An area ratio grayscale method refers to a driving method by which one pixel is divided into a plurality of subpixels and the subpixels are driven independently based on video signals so that grayscale is displayed. A time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than liquid-crystal display elements. Specifically, in the case of displaying with a time gray scale method, one frame period is divided into a plurality of subframe periods. Then, in accordance with video signals, the light-emitting element in the pixel is set in a light-emitting state or in a non-light-emitting state during each subframe period. By dividing one frame into a plurality of subframes, the total length of time, in which pixels actually emit light in one frame period, can be controlled with video signals so that gray scales are displayed.

In the example of the light-emitting display device illustrated in FIG. 17B, in a case where two switching TFTs are arranged in one pixel, the first scan line driver circuit 5402 generates a signal which is input to a first scan line serving as a gate wiring of one of the switching TFTs, and the second scan line driver circuit 5404 generates a signal which is input to a second scan line serving as a gate wiring of the other of the switching TFTs; however, one scan line driver circuit may generate both the signal which is input to the first scan line and the signal which is input to the second scan line. In addition, for example, there is a possibility that a plurality of scan lines used for controlling the operation of the switching elements be provided in each pixel depending on the number of switching TFTs included in one pixel. In that case, one scan line driver circuit may generate all signals that are input to the plurality of scan lines, or a plurality of scan line driver circuits may generate signals that are input to the plurality of scan lines.

Also in the light-emitting display device, a part of a driver circuit that can be formed with n-channel TFTs can be formed over the same substrate as the thin film transistors of the pixel portion.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute. Each microcapsule contains first particles which are positively charged and second particles which are negatively charged. By applying an electric field to the microcapsules, the particles in the microcapsules are moved in opposite directions to each other and only the color of the particles concentrated on one side is exhibited. Note that the first particles and the second particles each contain pigment and do not move without an electric field. Moreover, the colors of the first particles and the second particles are different from each other (the colors include colorless or achroma).

Thus, the electrophoretic display utilizes a so-called dielectrophoretic effect, in which a substance with high dielectric constant moves to a region with high electric field. The electrophoretic display does not need a polarizing plate and an opposite substrate, which are necessary for a liquid crystal display device, so that the thickness and weight thereof are about half.

A solution in which the aforementioned microcapsules are dispersed throughout a solvent is referred to as electronic ink. This electronic ink can be printed on a surface of glass, plastic, cloth, paper, or the like. Furthermore, by use of a color filter or particles that have a pigment, color display is possible, as well.

In addition, a plurality of the above microcapsules are arranged as appropriate over an active matrix substrate so as to be interposed between two electrodes, whereby an active matrix display device can be completed, and display can be performed by application of an electric field to the microcapsules. For example, the active matrix substrate including the thin film transistor (in which an oxide semiconductor layer including $SiO_x$ is used for a channel formation region and an oxide semiconductor including nitrogen is used for source and drain regions) described in Embodiment 2 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

Through the above process, a highly reliable display device as a semiconductor device can be manufactured.

This embodiment can be combined with any of the other embodiments as appropriate.

Embodiment 9

In this embodiment, an example of a light-emitting display device is described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 23:
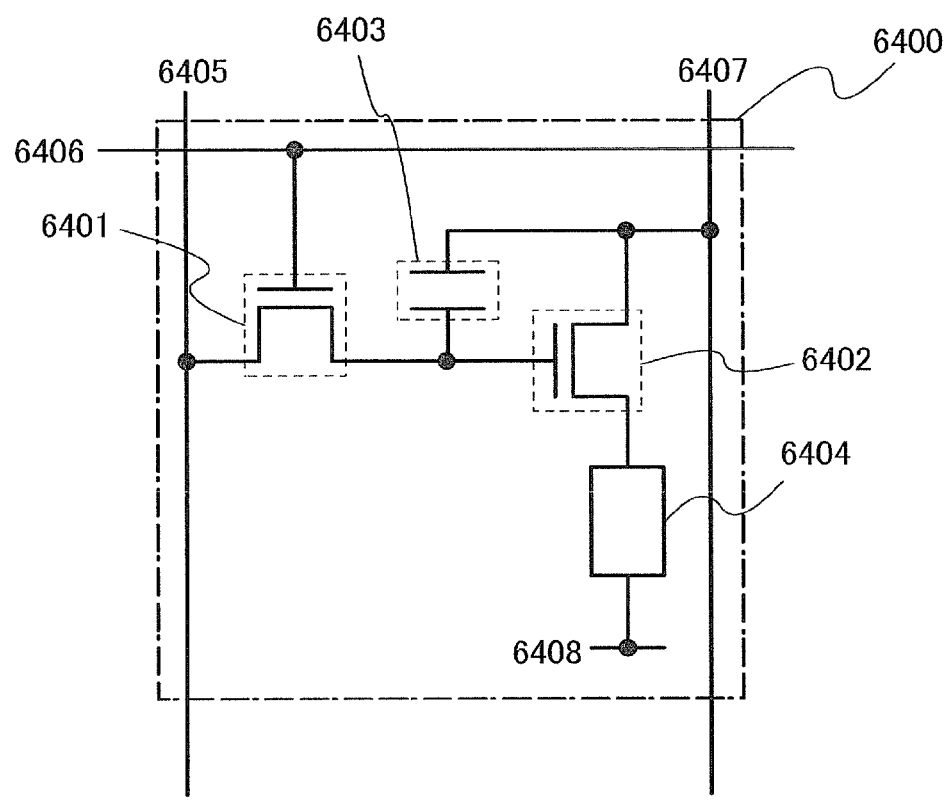
FIG. 23 is a diagram of an equivalent circuit of a pixel of a semiconductor device illustrating an embodiment of the present invention.

FIG. 23 illustrates an example of a pixel structure to which digital time grayscale driving can be applied, as an example of a semiconductor device.

A structure and an operation of a pixel to which digital time ratio gray scale driving can be applied are described. Here, one pixel includes two n-channel transistors in each of which an oxide semiconductor layer including $SiO_x$ (typically, an In—Ga—Zn—O-based non-single-crystal film) is used for a channel formation region and an In—Ga—Zn—O-based oxide semiconductor including nitrogen is used for source and drain regions.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate, and the connection portion thereof is a common connection portion.

The second electrode (the common electrode 6408) of the light-emitting element 6404 is set to a low power supply potential. Note that the low power supply potential is a potential smaller than a high power supply potential when the high power supply potential set to the power supply line 6407 is a reference. As the low power supply potential, GND, 0 V, or the like may be adopted, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher.

Note that gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on and turned off. That is, the driver transistor 6402 operates in a linear region. Since the driver transistor 6402 operates in a linear region, a voltage higher than the voltage of the power supply line 6407 is applied to the gate of the driver transistor 6402. Note that a voltage higher than or equal to (voltage of the power supply line+$V_{th}$ of the driver transistor 6402) is applied to the signal line 6405.

In the case of performing analog grayscale driving instead of digital time grayscale driving, the same pixel structure as that in FIG. 23 can be used by changing signal input.

In the case of performing analog grayscale driving, a voltage higher than or equal to the sum of the forward voltage of the light-emitting element 6404 and the $V_{th}$ of the driver transistor 6402 is applied to the gate of the driver transistor 6402. The forward voltage of the light-emitting element 6404 indicates a voltage at which a desired luminance is obtained, and includes at least a forward threshold voltage. The video signal by which the driver transistor 6402 operates in a saturation region is input, so that current can be supplied to the light-emitting element 6404. In order to make the driver transistor 6402 operate in a saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure illustrated in FIG. 23 is not limited thereto. For example, a switch, a resistor, a capacitor, a transistor, a logic circuit, or the like may be added to the pixel illustrated in FIG. 23.

Next, structures of the light-emitting element are described with reference to FIGS. 24A to 24C. A cross-sectional structure of a pixel is described by taking an n-channel driving TFT as an example. Driving TFTs 7001, 7011, and 7021 used for semiconductor devices illustrated in FIGS. 24A to 24C can be formed in a manner similar to formation of the thin film transistor 170 described in Embodiment 2 and are thin film transistors in each of which an oxide semiconductor layer including $SiO_x$ for a channel formation region and an oxide semiconductor including nitrogen is used for source and drain regions.

In order to extract light emission of a light-emitting element, at least one of an anode and a cathode may be transparent. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure can be applied to a light-emitting element having any of these emission structures.

A light-emitting element having a top emission structure is described with reference to FIG. 24A.

Figure 24A:
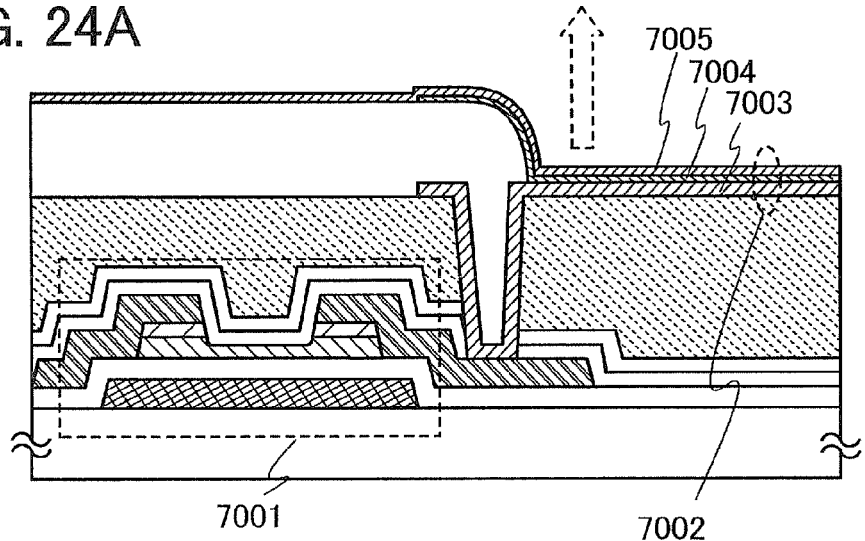
FIGS. 24A to 24C are each a cross-sectional view of a semiconductor device illustrating an embodiment of the present invention.
Figure 24B:
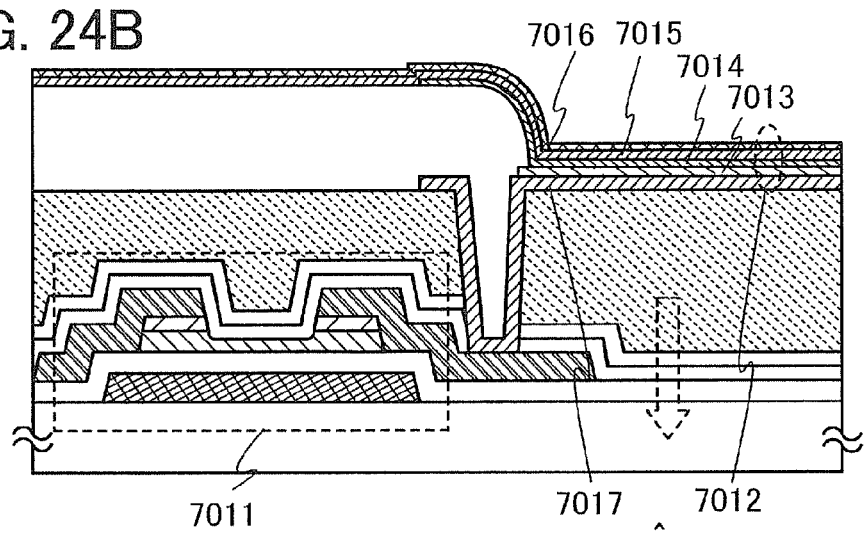
Figure 24C:
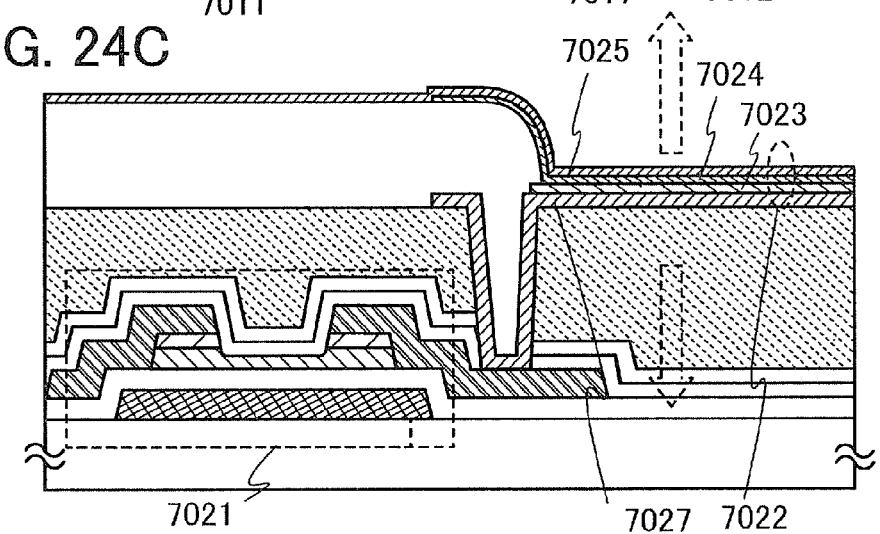

FIG. 24A is a cross-sectional view of a pixel in the case where the driving TFT 7001 is an n-channel TFT and light is emitted from a light-emitting element 7002 to an anode 7005 side. In the TFT 7001, an In—Sn—O-based oxide semiconductor including silicon oxide is used for a semiconductor layer and an In—Zn—O-based oxide semiconductor including nitrogen is used for source and drain regions. In FIG. 24A, a cathode 7003 of the light-emitting element 7002 is electrically connected to the driving TFT 7001, and a light-emitting layer 7004 and the anode 7005 are stacked in this order over the cathode 7003. The cathode 7003 can be formed using various conductive materials as long as they have a low work function and reflect light. For example, Ca, Al, MgAg, AlLi, or the like is preferably used. The light-emitting layer 7004 may be formed using either a single layer or a stacked layer of a plurality of layers. If the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, or indium tin oxide to which silicon oxide is added.

A region where the light-emitting layer 7004 is sandwiched between the cathode 7003 and the anode 7005 corresponds to the light-emitting element 7002. In the case of the pixel illustrated in FIG. 24A, light is emitted from the light-emitting element 7002 to the anode 7005 side as indicated by an arrow.

Next, a light-emitting element having a bottom emission structure is described with reference to FIG. 24B. FIG. 24B is a cross-sectional view of a pixel in a case where the driving TFT 7011 is an n-channel TFT, and light generated in a light-emitting element 7012 is emitted to pass through a cathode 7013. In the TFT 7011, an In—Zn—O-based oxide semiconductor including silicon oxide is used as a semiconductor layer and an In—Zn—O-based oxide semiconductor including nitrogen is used for source and drain regions. In FIG. 24B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A blocking film 7016 for reflecting or blocking light may be formed so as to cover the anode 7015 when the anode 7015 has a light-transmitting property. For the cathode 7013, a variety of materials can be used as in the case of FIG. 24A as long as they are conductive materials having a low work function. The cathode 7013 has a thickness that can transmit light (preferably, about 5 nm to 30 nm). For example, an aluminum film with a thickness of 20 nm can be used as the cathode 7013. Similar to the case of FIG. 24A, the light-emitting layer 7014 may be formed using either a single layer or a plurality of layers stacked. The anode 7015 need not transmit light, but can be formed using a light-transmitting conductive material as in the case of FIG. 24A. For the blocking film 7016, a metal or the like that reflects light can be used; however, it is not limited to a metal film. For example, a resin or the like to which black pigments are added can be used.

A region where the light-emitting layer 7014 is sandwiched between the cathode 7013 and the anode 7015 corresponds to the light-emitting element 7012. In the case of the pixel illustrated in FIG. 24B, light is emitted from the light-emitting element 7012 to the cathode 7013 side as indicated by an arrow.

Next, a light-emitting element having a dual emission structure is described with reference to FIG. 24C. In FIG. 24C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. In the TFT 7021, an In—Zn—O-based oxide semiconductor including silicon oxide is used as a semiconductor layer and a Zn—O-based oxide semiconductor including nitrogen is used for source and drain regions. As in the case of FIG. 24A, the cathode 7023 can be formed using a variety of conductive materials as long as they have a low work function. The cathode 7023 has a thickness that can transmit light. For example, an Al film having a thickness of 20 nm can be used as the cathode 7023. As in FIG. 24A, the light-emitting layer 7024 may be formed using either a single layer or a plurality of layers stacked. The anode 7025 can be formed using a light-transmitting conductive material as in the case of FIG. 24A.

A region where the cathode 7023, the light-emitting layer 7024, and the anode 7025 overlap with each other corresponds to the light-emitting element 7022. In the case of the pixel illustrated in FIG. 24C, light is emitted from the light-emitting element 7022 to both the anode 7025 side and the cathode 7023 side as indicated by arrows.

Although an organic EL element is described as a light-emitting element here, it is also possible to provide an inorganic EL element as a light-emitting element.

This embodiment describes an example in which a thin film transistor for controlling the drive of a light-emitting element (the driving TFT) is electrically connected to the light-emitting element. However, a current control TFT may be formed between the driving TFT and the light-emitting element to be connected to them.

Figure 25A:
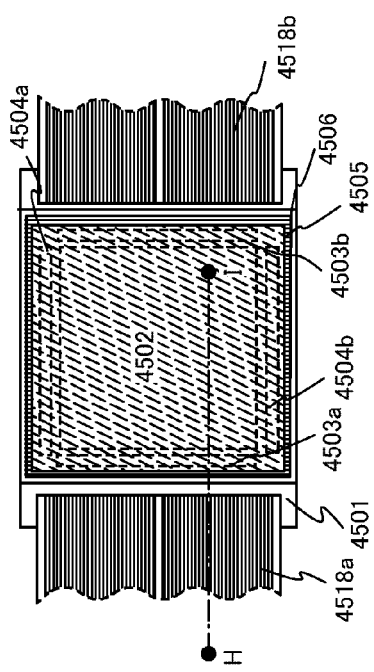
FIGS. 25A and 25B are a top view and a cross-sectional view, respectively, of a semiconductor device illustrating an embodiment of the present invention.
Figure 25B:
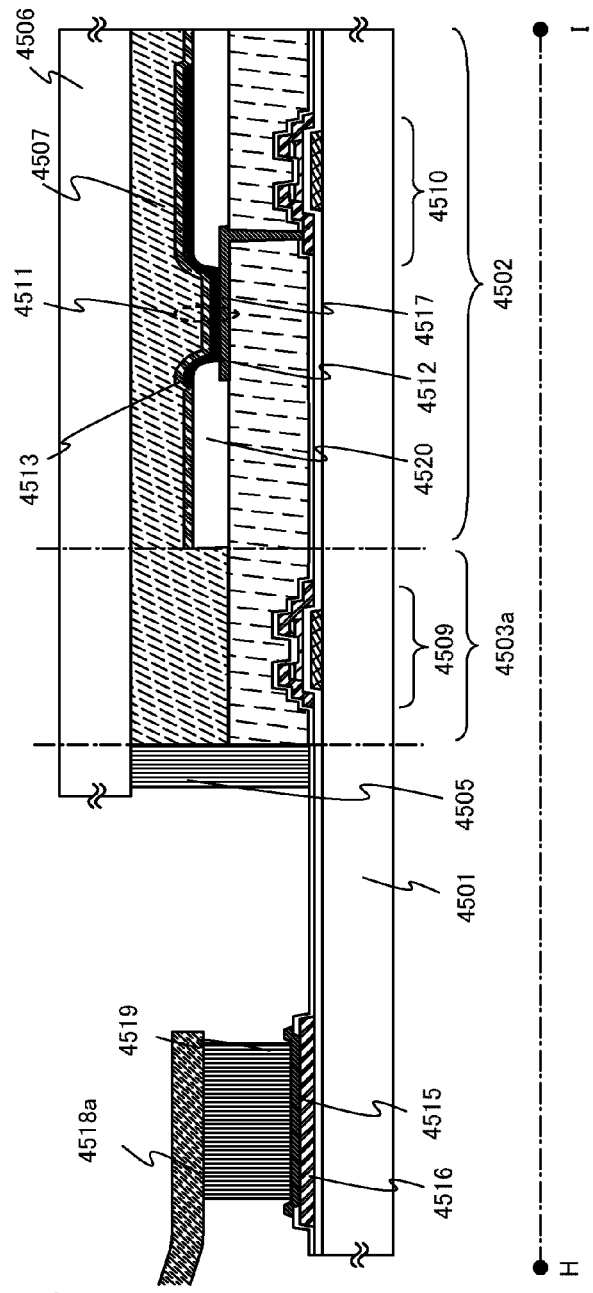

Next, the appearance and cross section of a light-emitting display panel (also referred to as a light-emitting panel) which corresponds to one mode of a semiconductor device are described with reference to FIGS. 25A and 25B. FIG. 25A is a top view of a panel in which a thin film transistor and a light-emitting element are sealed between a first substrate and a second substrate with a sealant. FIG. 25B is a cross-sectional view taken along the line H-I of FIG. 25A.

A sealant 4505 is provided to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 25B.

In each of the thin film transistors 4509 and 4510, an In—Zn—O-based oxide semiconductor including silicon oxide is used, and an In—Zn—O-based oxide semiconductor including nitrogen is used for source and drain regions. In this embodiment, the thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that a structure of the light-emitting element 4511 is a stacked-layer structure of the first electrode layer 4517, an electroluminescent layer 4512, and a second electrode layer 4513, but the present invention is not limited to that described in this embodiment. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition wall 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be provided as driver circuits formed using a single crystal semiconductor film or polycrystalline semiconductor film over a substrate separately prepared. In addition, only the signal line driver circuits or part thereof, or only the scan line driver circuits or part thereof may be separately formed and mounted. This embodiment is not limited to the structure illustrated in FIGS. 25A and 25B.

Through this process, a highly reliable light-emitting display device (display panel) as a semiconductor device can be manufactured.

This embodiment can be combined with any of the other embodiments as appropriate.

Embodiment 10

Thin film transistors in each of which an oxide semiconductor layer including $SiO_x$ is used for a channel formation region and an oxide semiconductor including nitrogen is used for source and drain regions are formed, and a liquid crystal display device having a display function, in which the thin film transistors are included in a driver circuit and a pixel portion, can be manufactured. Further, part or whole of a driver circuit can be formed over the same substrate as a pixel portion, using a thin film transistor, whereby a system-on-panel can be obtained.

The liquid crystal display device includes a liquid crystal element (also referred to as a liquid crystal display element) as a display element.

Further, a liquid crystal display device includes a panel in which a liquid crystal display element is sealed, and a module in which an IC or the like including a controller is mounted to the panel. An embodiment of the present invention also relates to an element substrate, which corresponds to one mode before the display element is completed in a manufacturing process of the liquid crystal display device, and the element substrate is provided with means for supplying current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of other states.

Note that a liquid crystal display device in this specification means an image display device, a display device, or a light source (including a lighting device). Furthermore, the liquid crystal display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by chip on glass (COG).

The appearance and a cross section of a liquid crystal display panel, which is one embodiment of a liquid crystal display device, is described with reference to FIGS. 26A1 and 26A2, and 26B. FIGS. 26A1 and A2 are top views of a panel in which a liquid crystal element 4013 is sealed between a first substrate 4001 and a second substrate 4006 with a sealant 4005. FIG. 26B is a cross-sectional view along line M-N of FIGS. 26A1 and A2.

The sealant 4005 is provided so as to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. There is no particular limitation on the liquid crystal layer 4008 in this embodiment, but a liquid crystal material exhibiting a blue phase is used. The liquid crystal material exhibiting a blue phase has a short response time of 1 msec or less from in the non-voltage-applied state to in the voltage-applied state and enables high-speed response. The liquid crystal material exhibiting a blue phase includes a liquid crystal and a chiral agent. The chiral agent is employed to align the liquid crystal in a helical structure and to make the liquid crystal exhibit a blue phase. For example, a liquid crystal material into which a chiral agent is mixed at 5 wt % or more may be used for the liquid crystal layer. As the liquid crystal, a thermotropic liquid crystal, a low-molecular liquid crystal, a high-molecular liquid crystal, a ferroelectric liquid crystal, an anti-ferroelectric liquid crystal, or the like is used.

In FIG. 26A1, a signal line driver circuit 4003 that is formed using a single crystal semiconductor film or a polycrystalline semiconductor film over a substrate separately prepared is mounted in a region that is different from the region surrounded by the sealant 4005 over the first substrate 4001. In contrast, FIG. 26A2 illustrates an example in which part of a signal line driver circuit 4003 is formed over the first substrate 4001. A signal line driver circuit 4003b is formed over the first substrate 4001 and a signal line driver circuit 4003a which is formed using a single crystal semiconductor film or a polycrystalline semiconductor film is mounted on the substrate separately prepared.

Note that there is no particular limitation on the connection method of a driver circuit which is separately formed, and a COG method, a wire bonding method, a TAB method, or the like can be used. FIG. 26A1 illustrates an example in which the signal line driver circuit 4003 is mounted by a COG method and FIG. 26A2 illustrates an example in which the signal line driver circuit 4003 is mounted by a TAB method.

Each of the pixel portion 4002 and the scan line driver circuit 4004 which are provided over the first substrate 4001 includes a plurality of thin film transistors. FIG. 26B illustrates a thin film transistor 4010 included in the pixel portion 4002 and a thin film transistor 4011 included in the scan line driver circuit 4004. Insulating layers 4020 and 4021 are provided over the thin film transistors 4010 and 4011. The thin film transistors 4010 and 4011 can be each a thin film transistor in which an oxide semiconductor layer including $SiO_x$ is used for a channel formation region and an oxide semiconductor including nitrogen is used for source and drain regions. In this embodiment, the thin film transistors 4010 and 4011 are n-channel thin film transistors.

A pixel electrode layer 4030 and a common electrode layer 4031 are provided over the first substrate 4001, and the pixel electrode layer 4030 is electrically connected to the thin film transistor 4010. The liquid crystal element 4013 includes the pixel electrode layer 4030, the common electrode layer 4031, and the liquid crystal layer 4008. In this embodiment, a method is used in which a gray scale is controlled by generating an electric field approximately parallel (i.e., in a lateral direction) to a substrate to move liquid crystal molecules in a plane parallel to the substrate. In such a method, an electrode structure used in an in plane switching (IPS) mode or an electrode structure used in a fringe field switching (FFS) mode can be used. Note that a polarizing plate 4032 and a polarizing plate 4033 are provided on the outer sides of the first substrate 4001 and the second substrate 4006, respectively.

As the first substrate 4001 and the second substrate 4006, glass, plastic, or the like having a light-transmitting property can be used. As plastic, a fiberglass-reinforced plastics (FRP) plate, a polyvinyl fluoride (PVF) film, a polyester film, or an acrylic resin film can be used. Further, sheet in which aluminum foil is sandwiched by PVF films or polyester films can also be used.

A columnar spacer denoted by reference numeral 4035 is obtained by selective etching of an insulating film and is provided in order to control the thickness (a cell gap) of the liquid crystal layer 4008. Note that a spherical spacer may be used.

FIGS. 26A1 and 26A2, and 26B illustrate examples of liquid crystal display devices in which a polarizing plate is provided on the outer side (the view side) of a substrate; however, the polarizing plate may be provided on the inner side of the substrate. The position of the polarizing plate may be determined as appropriate depending on the material of the polarizing plate and conditions of the manufacturing process. Furthermore, a light-blocking layer serving as a black matrix may be provided.

The insulating layer as an interlayer film 4021 is a light-transmitting resin layer, but it partly includes a light-blocking layer 4012. The light-blocking layer 4012 covers the thin film transistors 4010 and 4011. In FIGS. 26A1 and A2, and 26B, a light-blocking layer 4034 is provided on the second substrate 4006 side so as to cover the thin film transistors 4010 and 4011. By the light-blocking layer 4012 and the light-blocking layer 4034, improvement in contrast and stabilization of the thin film transistors can be achieved.

By providing the light-blocking layer 4034, the intensity of incident light on the semiconductor layer of the thin film transistor can be attenuated. Accordingly, electric characteristics of the thin film transistor can be prevented from being varied due to photosensitivity of the oxide semiconductor and can be stabilized.

The thin film transistors may be covered with the insulating layer 4020 which serves as a protective film of the thin film transistors; however, the structure of the thin film transistor is not particularly limited thereto.

Note that the protective film is provided to prevent entry of impurities floating in air, such as an organic substance, a metal substance, or moisture, and is preferably a dense film. The protective film may be formed by a sputtering method to be a single-layer film or a stacked layer using any of a silicon oxide film, a silicon nitride film, a silicon oxynitride film, a silicon nitride oxide film, an aluminum oxide film, an aluminum nitride film, an aluminum oxynitride film, and an aluminum nitride oxide film.

Further, in the case of further forming a light-transmitting insulating layer as a planarizing insulating film, the light-transmitting insulating layer can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The insulating layer may be formed by stacking a plurality of insulating films formed of these materials.

There is no particular limitation on the formation method of the insulating layer having a stacked structure, and the following method can be employed in accordance with the material: sputtering, an SOG method, spin coating, dip coating, spray coating, droplet discharging (e.g., ink jetting, screen printing, or offset printing), doctor knife, roll coating, curtain coating, knife coating, or the like. In the case where the insulating layer is formed using a material solution, the semiconductor layer may be annealed (at 200° C. to 400° C.) at the same time of a baking step. The baking step of the insulating layer is combined with the annealing step of the semiconductor layer, whereby a liquid crystal display device can be manufactured efficiently.

The pixel electrode layer 4030 and the common electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the pixel electrode layer 4030 and the common electrode layer 4031.

In addition, a variety of signals and potentials are supplied to the signal line driver circuit 4003 which is formed separately, and the scan line driver circuit 4004 or the pixel portion 4002 from an FPC 4018.

Further, since the thin film transistor is easily broken by static electricity or the like, a protection circuit for protecting the driver circuits is preferably provided over the same substrate for a gate line or a source line. The protection circuit is preferably formed using a nonlinear element in which an oxide semiconductor is used.

In FIGS. 26A1 and A2, and 26B, a connecting terminal electrode 4015 is formed using the same conductive film as the pixel electrode layer 4030, and a terminal electrode 4016 is formed using the same conductive film as source and drain electrode layers of the thin film transistors 4010 and 4011.

The connection terminal electrode 4015 is electrically connected to a terminal included in the FPC 4018 through an anisotropic conductive film 4019.

Although FIGS. 26A1 and A2, and 26B illustrate an example in which the signal line driver circuit 4003 is formed separately and mounted on the first substrate 4001, the present invention is not limited to this structure. The scan line driver circuit may be formed separately and then mounted, or only part of the signal line driver circuit or part of the scan line driver circuit may be formed separately and then mounted.

Figure 27:
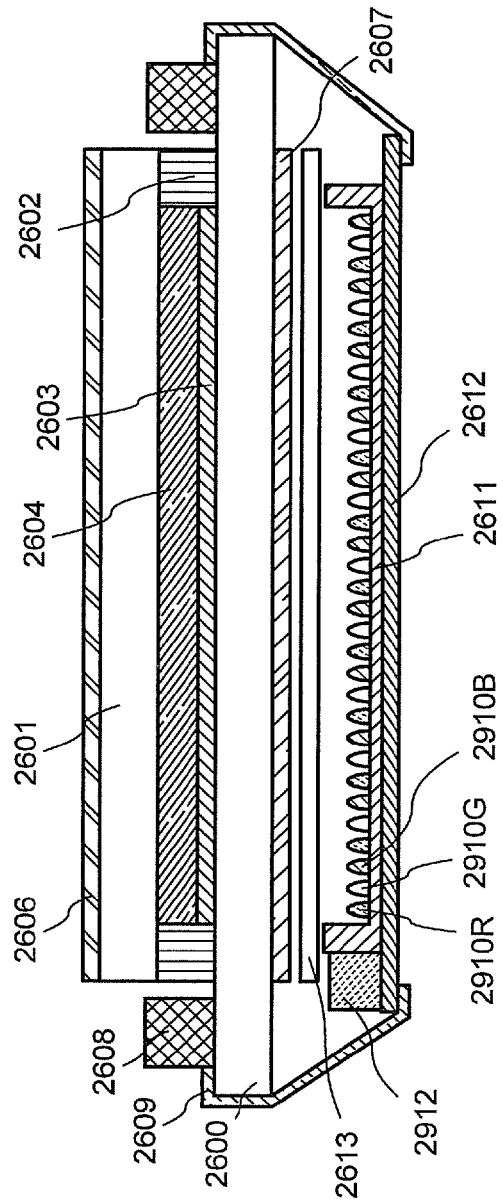
FIG. 27 is a cross-sectional view of a semiconductor device illustrating an embodiment of the present invention.

FIG. 27 illustrates an example of a cross-sectional structure of a liquid crystal display device in which an element layer including TFTs and the like and a liquid crystal layer 2604 are provided between an element substrate 2600 and a counter substrate 2601 which are bonded with a sealant 2602.

In the case where color display is performed, light-emitting diodes which emit lights of plural colors are arranged in a backlight portion. In the case of an RGB mode, a red light-emitting diode 2910R, a green light-emitting diode 2910G, and a blue light-emitting diode 2910B are disposed in each of the regions into which a display area of the liquid crystal display device is divided.

A polarizing plate 2606 is provided on the outer side of the counter substrate 2601, and a polarizing plate 2607 and an optical sheet 2613 are provided on the outer side of the element substrate 2600. A light source is formed using the red light-emitting diode 2910R, the green light-emitting diode 2910G, the blue light-emitting diode 2910B, and a reflective plate 2611. An LED control circuit 2912 provided for a circuit substrate 2612 is connected to a wiring circuit portion 2608 of the element substrate 2600 through a flexible wiring board 2609 and further includes an external circuit such as a control circuit or a power source circuit.

In this embodiment, an example in which LEDs are individually made to emit light by this LED control circuit 2912, so that a field-sequential liquid crystal display device is formed; however, the present invention is not limited thereto. A cold cathode tube or a white LED may be used as a light source of backlight, and a color filter may be provided.

Further, in this embodiment, an example of an electrode structure used in the IPS mode is described; however, there is no particularly limitation on an electrode structure mode. The following mode can be used: a TN (twisted nematic) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like.

This embodiment can be combined with any of the other embodiments as appropriate.

Embodiment 11

In this embodiment, an example of electronic paper is described as a semiconductor device.

Figure 28A:
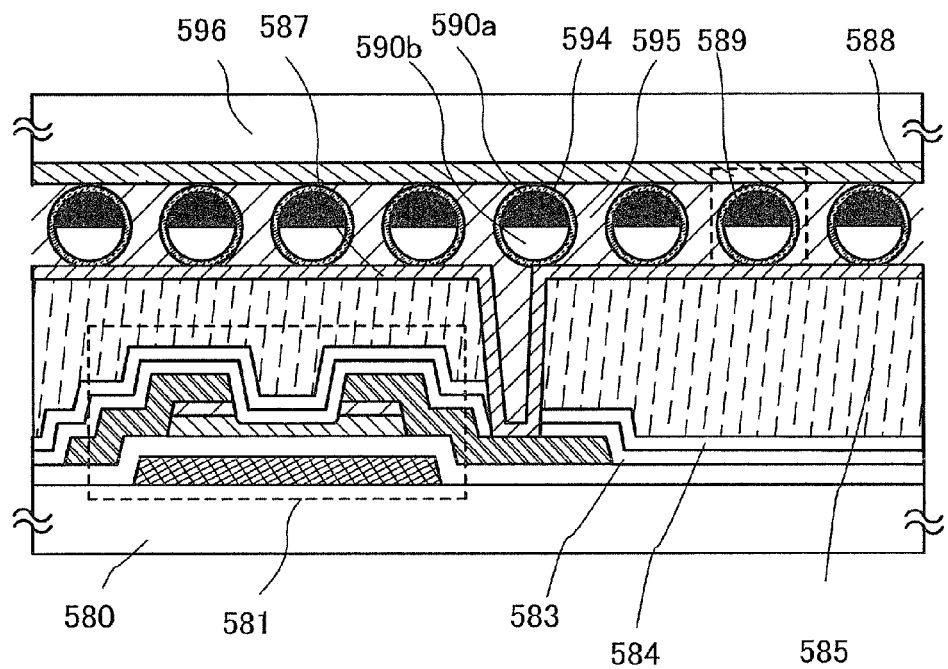
FIGS. 28A and 28B are a cross-sectional view and an external view, respectively, of an electronic appliance illustrating a semiconductor device of an embodiment of the present invention.

FIG. 28A is a cross-sectional view of an active-matrix electronic paper. A thin film transistor 581 provided in a display portion of a semiconductor device can be manufactured in a manner similar to the thin film transistor described in Embodiment 2, in which an oxide semiconductor layer including $SiO_x$ is used for a channel formation region and an oxide semiconductor including nitrogen is used for source and drain regions.

The electronic paper in FIG. 28A is an example of a display device using a twisting ball display method. A twisting ball display method employs a method in which display is performed by arranging spherical particles each of which is colored separately in black and white between the first electrode layer and the second electrode layer which are electrode layers used for display elements, and generating a potential difference between the first electrode layer and the second electrode layer so as to control the directions of the spherical particles.

The thin film transistor 581 which is sealed between a substrate 580 and a substrate 596 is a thin film transistor with a bottom-gate structure, and a source or drain electrode layer thereof is in contact with a first electrode layer 587 through an opening formed in insulating layers 583, 584, and 585, whereby the thin film transistor 581 is electrically connected to the first electrode layer 587. Between the first electrode layer 587 and a second electrode layer 588, spherical particles 589 are provided. Each spherical particle 589 includes a black region 590a and a white region 590b, and a cavity 594 filled with liquid around the black region 590a and the white region 590b. The circumference of the spherical particle 589 is filled with filler 595 such as a resin (see FIG. 28A).

In this embodiment, the first electrode layer 587 corresponds to a pixel electrode, and the second electrode layer 588 corresponds to a common electrode. The second electrode layer 588 is electrically connected to a common potential line provided over the same substrate as the thin film transistor 581. The second electrode layer 588 and the common potential line are electrically connected through conductive particles arranged between a pair of substrates, in the common connection portion.

Instead of the twisting ball, an electrophoretic element can also be used. A microcapsule having a diameter of approximately 10 μm to 20 μm, in which a transparent liquid and positively charged white microparticles and negatively charged black microparticles are encapsulated, is used. In the microcapsule that is provided between the first electrode layer and the second electrode layer, when an electric field is applied by the first electrode layer and the second electrode layer, the white microparticles and the black microparticles migrate to opposite sides to each other, so that white or black can be displayed. A display element using this principle is an electrophoretic display element and is called electronic paper. The electrophoretic display element has higher reflectivity than a liquid crystal display element; thus, an auxiliary light is unnecessary, less power is consumed, and a display portion can be recognized even in a dusky place. In addition, even when power is not supplied to the display portion, an image which has been displayed once can be maintained. Accordingly, a displayed image can be stored even if a semiconductor device having a display function (which may simply be referred to as a display device or a semiconductor device provided with a display device) is distanced from an electric wave source.

With use of the thin film transistor formed by the steps described in Embodiment 2, in which an oxide semiconductor layer including $SiO_x$ is used for a channel formation region and an oxide semiconductor including nitrogen is used for source and drain regions, electronic paper can be manufactured with reduced manufacturing cost, as a semiconductor device. Electronic paper can be used for electronic appliances of a variety of fields as long as they can display data. For example, electronic paper can be applied to an e-book reader (electronic book), a poster, an advertisement in a vehicle such as a train, or displays of various cards such as a credit card. An example of the electronic apparatus is illustrated in FIG. 28B.

Figure 28B:
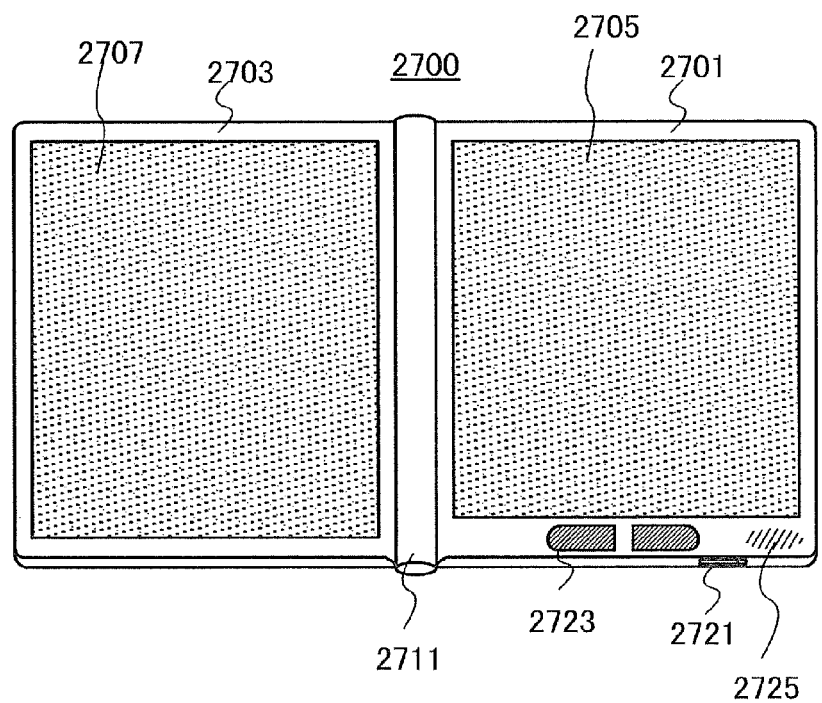

FIG. 28B illustrates an example of an e-book 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 28B) can display text whereas a display portion on the left side (the display portion 2707 in FIG. 28B) can display graphics.

In the example illustrated in FIG. 28B, the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

This embodiment can be combined with any of the other embodiments as appropriate.

Embodiment 12

A semiconductor device including a thin film transistor in which an oxide semiconductor layer including $SiO_x$ is used for a channel formation region and an oxide semiconductor including nitrogen is used for source and drain regions can be applied to a variety of electronic appliances (including amusement machines). Examples of electronic appliances include television sets (also referred to as televisions or television receivers), monitor of computers or the like, cameras such as digital cameras or digital video cameras, digital photo frames, cellular phones (also referred to as mobile phones or mobile phone sets), portable game machines, portable information terminals, audio reproducing devices, large-sized game machines such as pachinko machines, and the like.

FIG. 29A illustrates an example of a television set 9601. In the television set 9601, a display portion 9603 is incorporated in a housing. The display portion 9603 can display images. In addition, illustrated in FIG. 29A is the structure in which the rear side of the housing is supported by fixing to a wall 9600.

The television set 9601 can be operated with an operation switch of the housing or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9601 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

FIG. 29B is a portable game machine and includes two housings, a housing 9881 and a housing 9891, which are connected with a joint portion 9893 so that the portable game machine can be opened or folded. A display portion 9882 and a display portion 9883 are incorporated in the housing 9881 and the housing 9891, respectively. In addition, the portable amusement machine illustrated in FIG. 29B includes a speaker portion 9884, a recording medium insert portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device may be employed. The portable amusement machine may include other accessory equipment, as appropriate. The portable amusement machine illustrated in FIG. 29B has a function of reading a program or data stored in a recording medium to display it on the display portion, and a function of sharing information with another portable amusement machine via wireless communication. The portable game machine in FIG. 29B can have various functions such as, but not limited to, a function to the above.

Figure 30A:
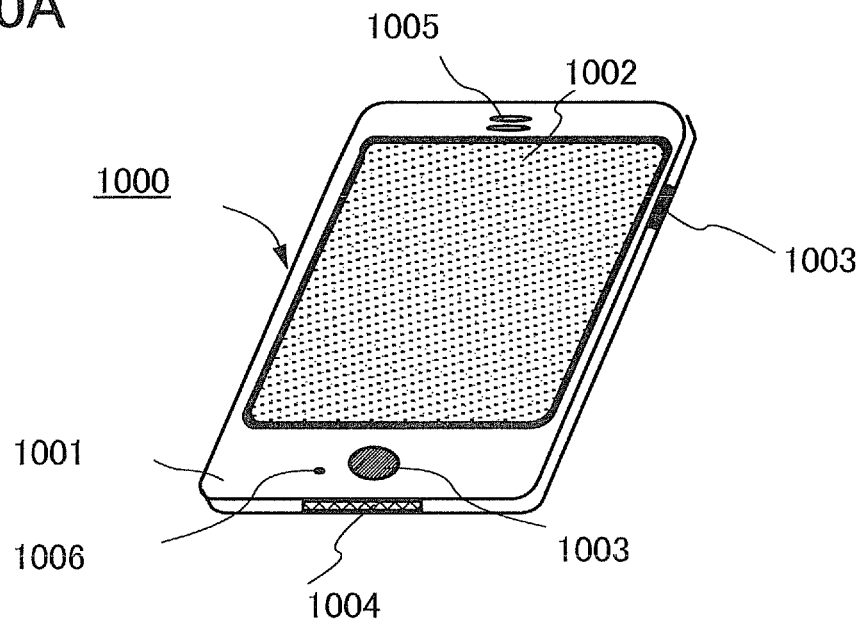
FIGS. 30A and 30B each illustrate an electronic appliance of an embodiment of the present invention.

FIG. 30A illustrates an example of a mobile phone 1000. The cellular phone 1000 is provided with a display portion 1002 incorporated in a housing 1001, operation buttons 1003, an external connection port 1004, a speaker 1005, a microphone 1006, and the like.

Data can be input to the mobile phone 1000 illustrated in FIG. 30A by touching the display portion 1002 with a finger or the like. Furthermore, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting information such as text. The third mode is a display-and-input mode in which two modes of the display mode and the input mode are mixed.

For example, in the case of making a call or composing a mail, a text input mode mainly for inputting text is selected for the display portion 1002 so that text displayed on a screen can be input. In that case, it is preferable to display a keyboard or number buttons on almost all the area of the screen of the display portion 1002.

Further, a detector including a sensor for detecting inclination, such as a gyroscope or an acceleration sensor, may be provided inside the mobile phone 1000, so that display on the screen of the display portion 1002 can be automatically switched by determining the direction of the mobile phone 1000 (whether the mobile phone 1000 is placed horizontally or vertically for a landscape mode or a portrait mode).

The screen mode is switched by touching the display portion 1002 or operating the operation buttons 1003 of the housing 1001. The screen modes can also be switched depending on kinds of images displayed in the display portion 1002. For example, when a signal for an image displayed in the display portion is data of moving images, the screen mode is switched to the display mode, whereas when the signal is text data, the screen mode is switched to the input mode.

Moreover, in the input mode, when input by touching the display portion 1002 is not performed within a specified period while a signal detected by the optical sensor in the display portion 1002 is detected, the screen mode may be controlled so as to be switched from the input mode to the display mode.

The display portion 1002 can also function as an image sensor. For example, an image of a palm print, a fingerprint, or the like is taken by touching the display portion 1002 with the palm or the finger, whereby personal authentication can be performed. Furthermore, by providing a backlight or a sensing light source emitting a near-infrared light for the display portion, an image of a finger vein, a palm vein, or the like can also be taken.

Figure 30B:
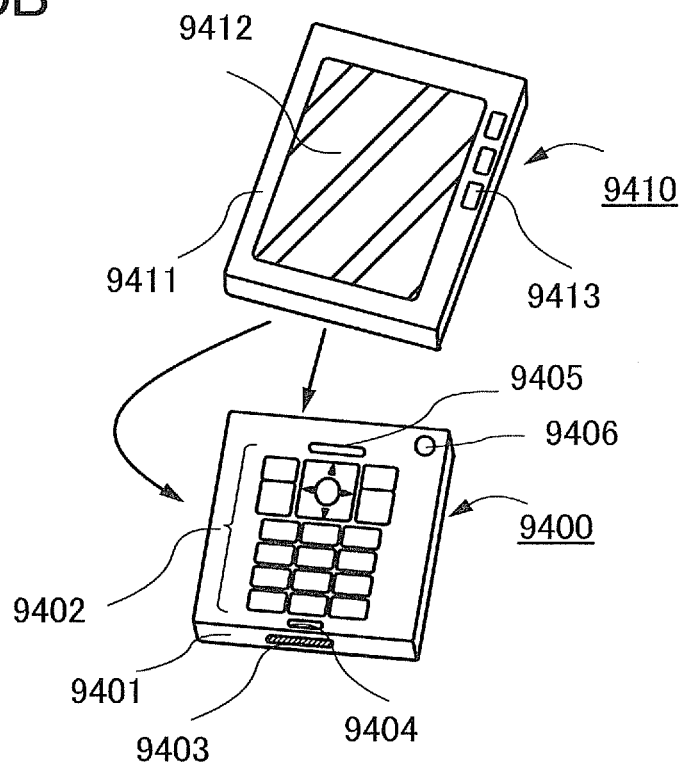

FIG. 30B also illustrates an example of a mobile phone. The mobile phone illustrated in FIG. 30B is provided with a display device 9410 having a display portion 9412 and operation buttons 9413 in a housing 9411 and a communication device 9400 having an operation buttons 9402, an external input terminal 9403, a microphone 9404, a speaker 9405, and a light-emitting portion 9406 which emits light when receiving a call in a housing 9401. The display device 9410 having a display function can be detached from or attached to the communication device 9400 having a telephone function in two directions indicated by arrows. Therefore, the display device 9410 and the communication device 9400 can be attached to each other along either of respective short axes or long axes. In the case where only the display function is needed, the display device 9410 can be detached from the communication device 9400 and used alone. Images or input data can be transmitted or received by wireless or wire communication between the communication device 9400 and the display device 9410, each of which has a rechargeable battery.

This embodiment can be combined with any of the other embodiments as appropriate.

This application is based on Japanese Patent Application serial no. 2009-013532 filed with Japan Patent Office on Jan. 23, 2009, the entire contents of which are hereby incorporated by reference.

What is claimed is:

1. A semiconductor device comprising:
a gate electrode;
an oxide semiconductor layer adjacent to the gate electrode;
an insulating layer between the gate electrode and the oxide semiconductor layer;
a source electrode electrically connected to the oxide semiconductor layer through a source region;
a drain electrode electrically connected to the oxide semiconductor layer through a drain region,
wherein the oxide semiconductor layer comprises a portion including silicon,
wherein a concentration of silicon in the portion including silicon is larger than a concentration of silicon in the source region and the drain region,
wherein the gate electrode comprises a stack of a first layer comprising copper and a second layer comprising a conductive material having heat resistance higher than copper.

2. The semiconductor device according to claim 1, wherein the oxide semiconductor layer comprises indium.

3. The semiconductor device according to claim 1, wherein the oxide semiconductor layer comprises an In—Ga—Zn-based oxide semiconductor.

4. The semiconductor device according to claim 1, wherein the oxide semiconductor layer comprises a channel region that overlaps with the gate electrode.

5. The semiconductor device according to claim 1, wherein a whole of the oxide semiconductor layer overlaps with the gate electrode.

6. The semiconductor device according to claim 1, wherein the gate electrode is provided under the oxide semiconductor layer.

7. The semiconductor device according to claim 1, further comprising a second insulating layer comprising silicon oxide over the oxide semiconductor layer, the source electrode and the drain electrode,
wherein the second insulating layer is in contact with an upper surface of the oxide semiconductor layer.

8. A semiconductor device comprising:
a gate electrode;
an oxide semiconductor layer adjacent to the gate electrode;
an insulating layer between the gate electrode and the oxide semiconductor layer;
a source electrode electrically connected to the oxide semiconductor layer through a source region;
a drain electrode electrically connected to the oxide semiconductor layer through a drain region,
wherein the oxide semiconductor layer comprises a portion including silicon,
wherein a concentration of silicon in the portion including silicon is larger than a concentration of silicon in the source region and the drain region,
wherein the gate electrode comprises a stack of a first layer comprising copper and a second layer comprising one selected from the group consisting of titanium, molybdenum and tungsten.

9. The semiconductor device according to claim 8, wherein the oxide semiconductor layer comprises indium.

10. The semiconductor device according to claim 8, wherein the oxide semiconductor layer comprises an In—Ga—Zn-based oxide semiconductor.

11. The semiconductor device according to claim 8, wherein the oxide semiconductor layer comprises a channel region that overlaps with the gate electrode.

12. The semiconductor device according to claim 8, wherein a whole of the oxide semiconductor layer overlaps with the gate electrode.

13. The semiconductor device according to claim 8, wherein the gate electrode is provided under the oxide semiconductor layer.

14. The semiconductor device according to claim 8, wherein the second layer comprises titanium.

15. The semiconductor device according to claim 8, further comprising a second insulating layer comprising silicon oxide over the oxide semiconductor layer, the source electrode and the drain electrode,
wherein the second insulating layer is in contact with an upper surface of the oxide semiconductor layer.

16. A semiconductor device comprising:
a gate electrode;
an oxide semiconductor layer adjacent to the gate electrode;
an insulating layer between the gate electrode and the oxide semiconductor layer;
a source electrode electrically connected to the oxide semiconductor layer through a source region;
a drain electrode electrically connected to the oxide semiconductor layer through a drain region,
wherein the oxide semiconductor layer comprises a portion including silicon,
wherein a concentration of silicon in the portion including silicon is larger than a concentration of silicon in the source region and the drain region, wherein the gate electrode comprises a stack of a first layer comprising copper and a second layer comprising one selected from the group consisting of titanium, molybdenum and tungsten, wherein each of the source region and the drain region comprises nitrogen and oxygen.

17. The semiconductor device according to claim 16, wherein the oxide semiconductor layer comprises indium.

18. The semiconductor device according to claim 16, wherein the oxide semiconductor layer comprises an In—Ga—Zn-based oxide semiconductor.

19. The semiconductor device according to claim 16, wherein the oxide semiconductor layer comprises a channel region that overlaps with the gate electrode.

20. The semiconductor device according to claim 16, wherein a whole of the oxide semiconductor layer overlaps with the gate electrode.

21. The semiconductor device according to claim 16, wherein the gate electrode is provided under the oxide semiconductor layer.

22. The semiconductor device according to claim 16, further comprising a second insulating layer comprising silicon oxide over the oxide semiconductor layer, the source electrode and the drain electrode, wherein the second insulating layer is in contact with an upper surface of the oxide semiconductor layer.

23. The semiconductor device according to claim 16, wherein the second layer comprises titanium.

24. A semiconductor device comprising:
a gate electrode;
an oxide semiconductor layer adjacent to the gate electrode, the oxide semiconductor layer comprising a channel region;
an insulating layer between the gate electrode and the oxide semiconductor layer;
a source electrode electrically connected to the oxide semiconductor layer through a source region;
a drain electrode electrically connected to the oxide semiconductor layer through a drain region,
wherein a concentration of silicon in a portion of the oxide semiconductor layer is larger than a concentration of silicon in at least one of the source region and the drain region,
wherein the gate electrode comprises a stack of a first layer comprising copper and a second layer comprising a conductive material having heat resistance higher than copper.

25. The semiconductor device according to claim 24, wherein the oxide semiconductor layer comprises an In—Ga—Zn-based oxide semiconductor.

26. The semiconductor device according to claim 24, wherein a whole of the oxide semiconductor layer overlaps with the gate electrode.

27. The semiconductor device according to claim 24, wherein the gate electrode is provided under the oxide semiconductor layer.

28. The semiconductor device according to claim 24, further comprising a second insulating layer comprising silicon oxide over the oxide semiconductor layer, the source electrode and the drain electrode, wherein the second insulating layer is in contact with an upper surface of the oxide semiconductor layer.

29. The semiconductor device according to claim 24, wherein the conductive material is one selected from the group consisting of titanium, molybdenum and tungsten.

* * * * *